(12) United States Patent  
Futamura et al.

(10) Patent No.: US 12,166,002 B2  
(45) Date of Patent: Dec. 10, 2024

(54) SEMICONDUCTOR DEVICE INCLUDING A SEMICONDUCTOR ELEMENT HAVING ELECTRODES INSERTED INTO RECESS PORTIONS OF A CONDUCTIVE MEMBER

(71) Applicant: ROHM Co., LTD., Kyoto (JP)

(72) Inventors: Yosui Futamura, Kyoto (JP); Akinori Nii, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 0 days.

(21) Appl. No.: 17/454,299

(22) Filed: Nov. 10, 2021

(65) Prior Publication Data

US 2022/0157758 A1 May 19, 2022

(30) Foreign Application Priority Data

Nov. 13, 2020 (JP) ................................. 2020-189567

(51) Int. Cl.
*H01L 23/495* (2006.01)
*H01L 23/00* (2006.01)
*H01L 23/31* (2006.01)

(52) U.S. Cl.
CPC .......... *H01L 24/16* (2013.01); *H01L 23/3121* (2013.01); *H01L 23/49548* (2013.01);
(Continued)

(58) Field of Classification Search
CPC ......... H01L 24/13; H01L 24/16; H01L 24/32; H01L 24/73; H01L 2224/13147;
(Continued)

(56) References Cited

U.S. PATENT DOCUMENTS 7,443,015 B2 * 10/2008 Punzalan ................ H01L 24/16  
257/676  
8,237,273 B2 * 8/2012 Hsu ........................ H01L 24/16  
257/E23.06  
(Continued)

FOREIGN PATENT DOCUMENTS

JP 2019191417 10/2019  
JP 2020167330 10/2020  
WO WO2019093427 11/2020

OTHER PUBLICATIONS

Notification for Refusal in Japanese Application No. 2020189567, mailed Jul. 23, 2024.  
(Continued)

*Primary Examiner* — Khiem D Nguyen  
(74) *Attorney, Agent, or Firm* — CHIP LAW GROUP

(57) ABSTRACT

Provided is a semiconductor device including a conductive member including a main surface facing one side in a thickness direction; a semiconductor element including a plurality of pads facing the main surface of the conductive member; and a plurality of electrodes protruding from the plurality of pads toward the other side in the thickness direction. The conductive member includes a plurality of recessed portions recessed from the main surface toward the other side in the thickness direction. The semiconductor device further includes a bonding layer that is conductive and that is arranged in each of the plurality of recessed portions. The plurality of electrodes are separately inserted into the plurality of recessed portions. The conductive member and the plurality of electrodes are bonded through the bonding layers.

18 Claims, 16 Drawing Sheets

(52) U.S. Cl.
CPC ............. *H01L 24/13* (2013.01); *H01L 24/32* (2013.01); *H01L 24/73* (2013.01); *H01L 2224/13147* (2013.01); *H01L 2224/13582* (2013.01); *H01L 2224/13655* (2013.01); *H01L 2224/13664* (2013.01); *H01L 2224/16257* (2013.01); *H01L 2224/32245* (2013.01); *H01L 2224/73204* (2013.01); *H01L 2924/3512* (2013.01)

(58) Field of Classification Search
CPC . H01L 2224/13582; H01L 2224/13655; H01L 2224/13664; H01L 2224/16257; H01L 2224/32245; H01L 23/3121; H01L 23/49548; H01L 23/49541; H01L 23/49562; H01L 23/49582; H01L 24/81; H01L 2224/16112; H01L 2224/8184; H01L 2224/81801; H01L 2224/73204; H01L 2224/16245; H01L 2924/00
USPC ........................................................ 257/666
See application file for complete search history.

(56) References Cited

U.S. PATENT DOCUMENTS

| | | | | |
|---|---|---|---|---|
| 9,425,174 | B1* | 8/2016 | Hin | H01L 23/49811 |
| 9,984,993 | B2* | 5/2018 | Shu | H01L 21/563 |
| 10,475,729 | B2* | 11/2019 | Gupta | H01L 23/3142 |
| 10,872,845 | B2* | 12/2020 | Mazzola | H01L 21/4825 |
| 2006/0125113 | A1* | 6/2006 | Liu | H01L 23/4952 257/E23.033 |
| 2012/0061822 | A1* | 3/2012 | Pagaila | H01L 24/16 257/737 |
| 2013/0241030 | A1* | 9/2013 | Do | H01L 24/14 257/522 |
| 2014/0264846 | A1* | 9/2014 | Chen | H01L 25/0652 257/737 |
| 2016/0372430 | A1* | 12/2016 | Arvin | H01L 24/13 |
| 2017/0170101 | A1 | 6/2017 | Arguelles et al. | |
| 2017/0200688 | A1* | 7/2017 | Kim | H01L 23/49827 |
| 2018/0166365 | A1* | 6/2018 | Hwang | H01L 23/3107 |
| 2019/0043789 | A1* | 2/2019 | Mangrum | H01L 23/49548 |
| 2019/0191565 | A1* | 6/2019 | Oka | H05K 3/3436 |
| 2020/0144211 | A1* | 5/2020 | Fujii | H01L 24/29 |
| 2020/0194350 | A1* | 6/2020 | Milo | H01L 23/49548 |
| 2020/0312806 | A1* | 10/2020 | Takei | H01L 24/17 |

OTHER PUBLICATIONS

Notice of Reasons for Refusal cited in Japanese Application No. 2020189567, mailed on Aug. 20, 2024.

* cited by examiner

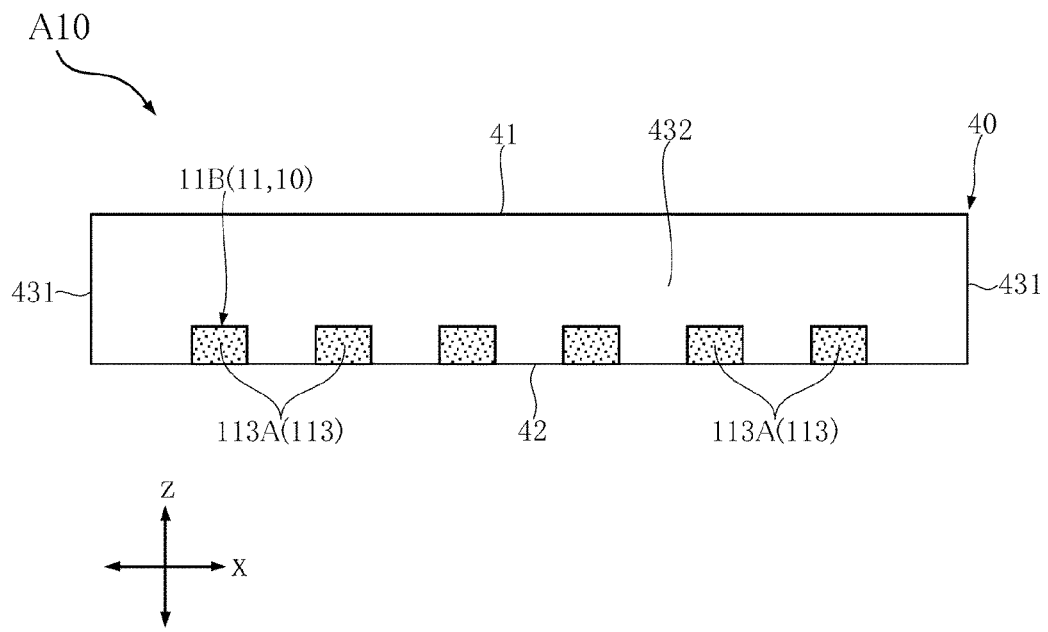
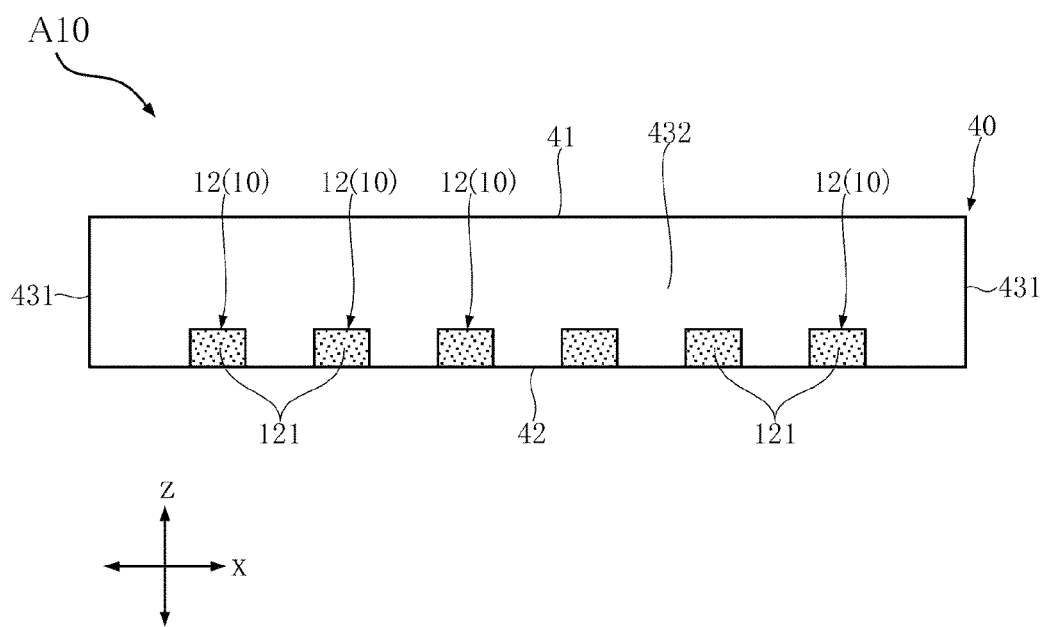

SEMICONDUCTOR DEVICE INCLUDING A SEMICONDUCTOR ELEMENT HAVING ELECTRODES INSERTED INTO RECESS PORTIONS OF A CONDUCTIVE MEMBER

CROSS REFERENCE TO RELATED APPLICATIONS

This application claims priority benefit of Japanese Patent Application No. JP 2020-189567 filed in the Japan Patent Office on Nov. 13, 2020. Each of the above-referenced applications is hereby incorporated herein by reference in its entirety.

BACKGROUND

The present disclosure relates to a semiconductor element bonded to a conductive member through flip chip assembly.

There has been a widely known semiconductor device including a semiconductor element bonded to a conductive member (such as a lead frame) through flip assembly. An example of such a semiconductor device is disclosed in Japanese Patent Laid-Open No. 2018-85522 (hereinafter, referred to as Patent Document 1). In the semiconductor device, a plurality of electrodes of a semiconductor element (semiconductor chip in Patent Document 1) are bonded to a conductive member (lead wire in Patent Document 1) through a bonding layer (conductor bump in Patent Document 1). The plurality of electrodes of the semiconductor element are facing the conductive member.

The bonding layer of the semiconductor device disclosed in Patent Document 1 contains solder. Therefore, if the number of electrodes is increased according to circuits included in the semiconductor element, there may be short circuit in the plurality of electrodes due to the fused bonding layer when the plurality of electrodes are bonded to the conductive member through the bonding layer. Further, thermal stress is applied to the bonding layer due to the heat generated from the semiconductor element. The thermal stress tends to cause a crack when the bonding layer contains solder. Therefore, measures need to be taken to address these issues.

SUMMARY

In view of the circumstances, it is desirable to provide a semiconductor device that can prevent short circuit of a plurality of electrodes and suppress generation of a crack in a bonding layer.

According to an embodiment of the present disclosure, provided is a semiconductor device including a conductive member including a main surface facing one side in a thickness direction; a semiconductor element including a plurality of pads facing the main surface of the conductive member; and a plurality of electrodes protruding from the plurality of pads toward the other side in the thickness direction. The conductive member includes a plurality of recessed portions recessed from the main surface toward the other side in the thickness direction. The semiconductor device further includes a bonding layer that is conductive and that is arranged in each of the plurality of recessed portions. The plurality of electrodes are separately inserted into the plurality of recessed portions. The conductive member and the plurality of electrodes are bonded through the bonding layers.

According to the semiconductor device and a manufacturing method of the semiconductor device in an embodiment of the present disclosure, the short circuit of the plurality of electrodes can be prevented, and the generation of a crack in the bonding layer can be suppressed.

Other features and advantages of the present disclosure will become more apparent from the following detailed description based on the attached drawings.

BRIEF DESCRIPTION OF THE DRAWINGS

FIG. 7 is a right side view of the semiconductor device illustrated in FIG. 1;

FIG. 8 is a left side view of the semiconductor device illustrated in FIG. 1;

DETAILED DESCRIPTION OF THE PREFERRED EMBODIMENTS

Modes for carrying out the present disclosure will be described with reference to the attached drawings. Each of the attached drawings is schematically depicted. There may be omitted parts and exaggerated parts in each of the attached drawings.

First Embodiment

Figure 1:
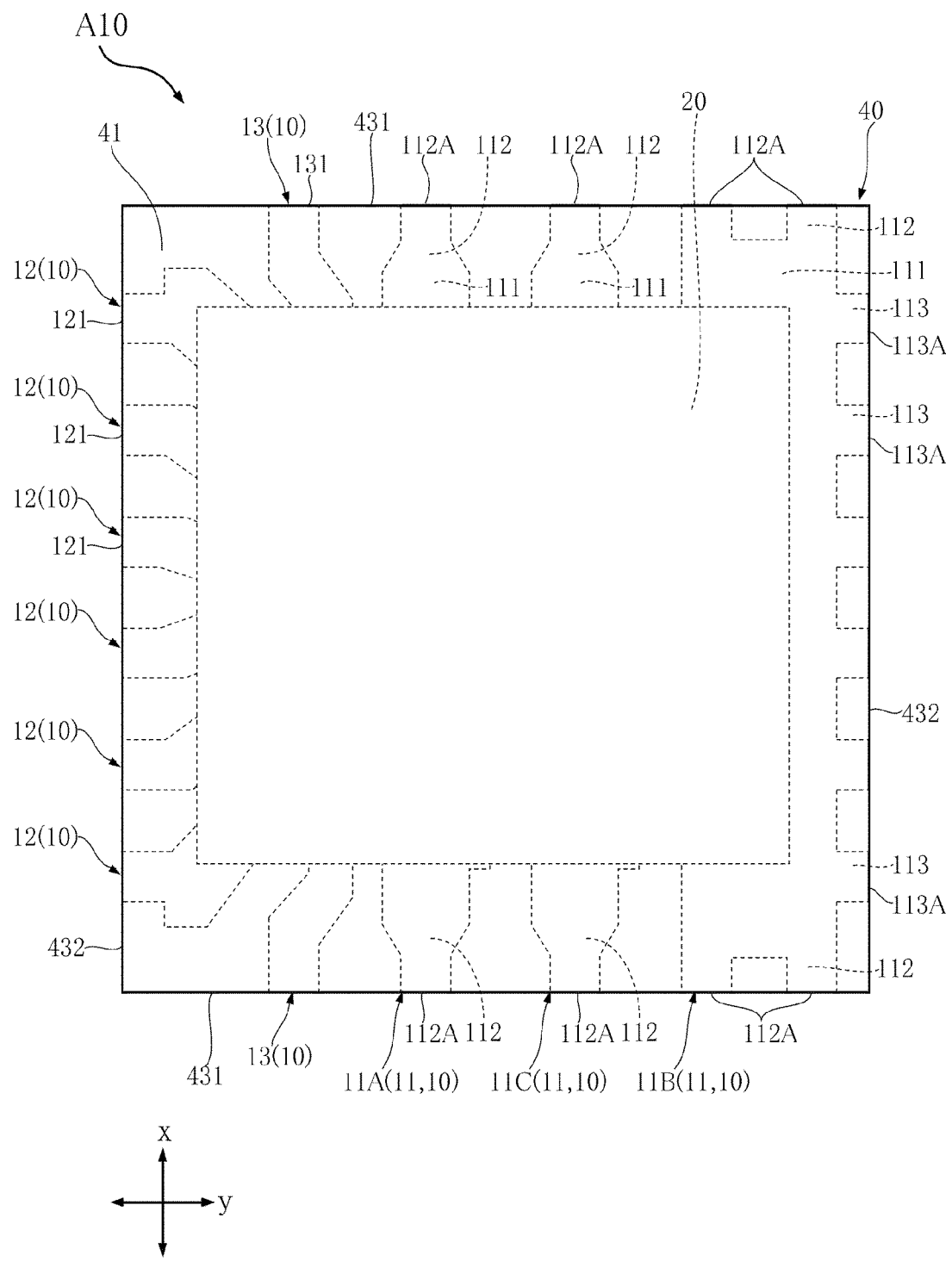
FIG. 1 is a plan view of a semiconductor device according to a first embodiment of the present disclosure.
Figure 2:
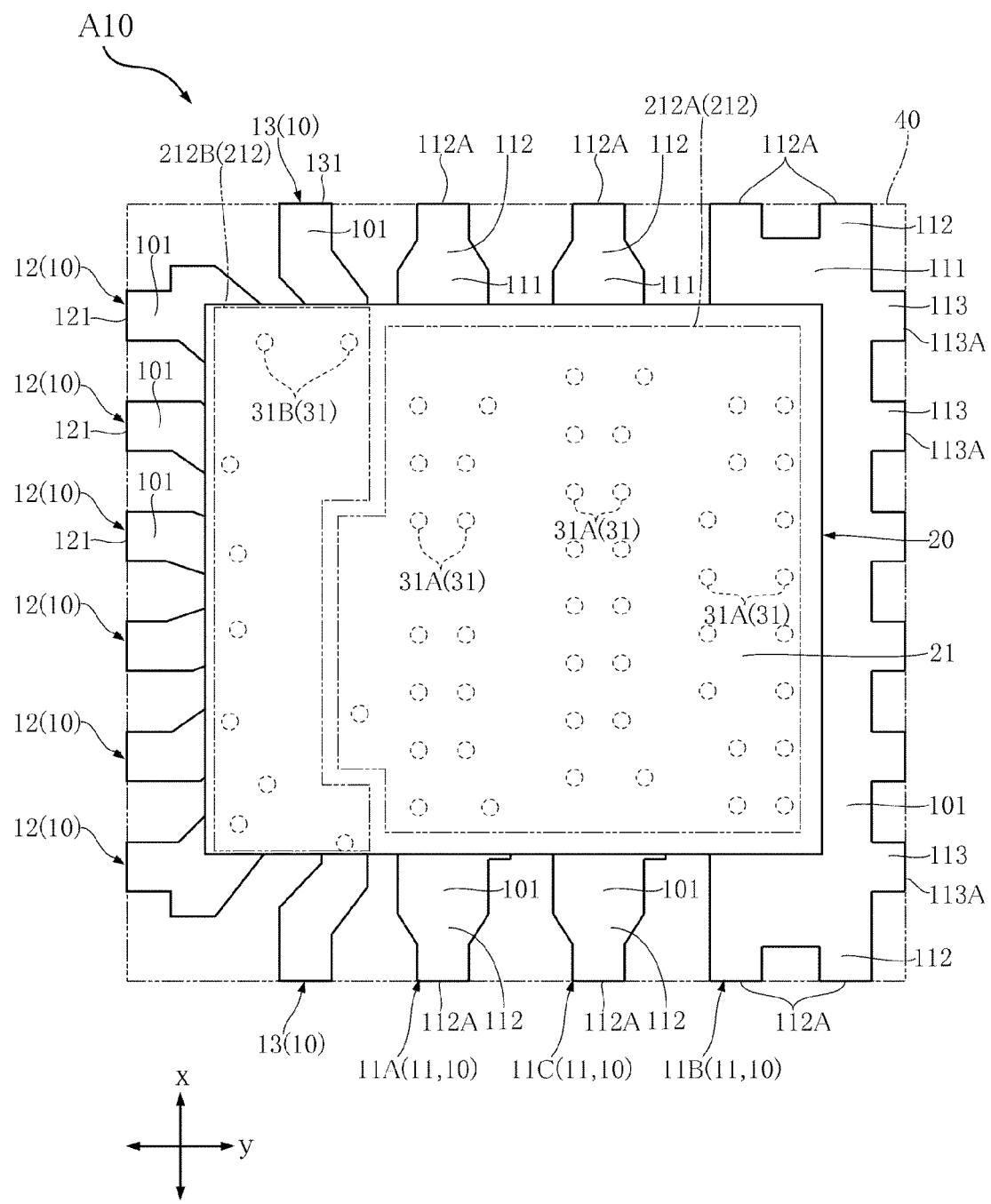
FIG. 2 is a plan view of the semiconductor device corresponding to FIG. 1, in which a sealing resin is transparent.
Figure 3:
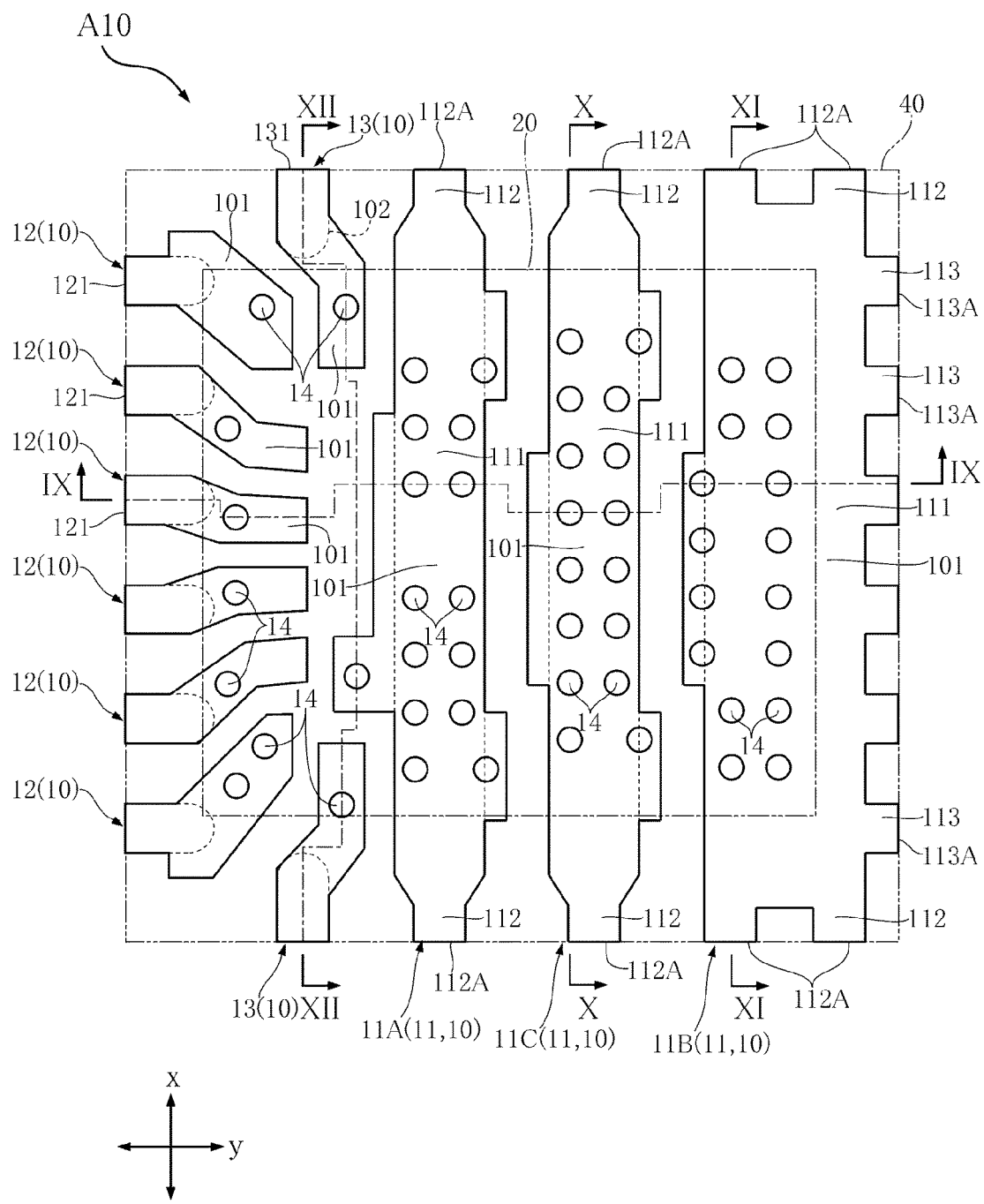
FIG. 3 is a plan view of the semiconductor device corresponding to FIG. 2, in which a semiconductor element, a plurality of electrodes, and a bonding layer are also transparent.

A semiconductor device A10 according to a first embodiment of the present disclosure will be described with reference to FIGS. 1 to 14. The semiconductor device A10 includes a conductive member 10, a semiconductor element 20, a plurality of electrodes 31, a bonding layer 32, and a sealing resin 40. As illustrated in FIG. 1, the package format of the semiconductor device A10 is quad flat non-lead package (QFN). The semiconductor element 20 is flip-chip large scale integration (LSI). A switching circuit 212A and a control circuit 212B (details of the circuits will be described later) are provided inside the semiconductor element 20. In the semiconductor device A10, the switching circuit 212A converts direct current (DC) power (voltage) into alternating current (AC) power (voltage). The semiconductor device A10 is used as, for example, an element included in a circuit of a DC/DC converter. In FIG. 2, the sealing resin 40 is transparent for the convenience of understanding. In FIG. 3, the semiconductor element 20, the plurality of electrodes 31, and the bonding layer 32 are also transparent in addition to the sealing resin 40 of FIG. 2 for the convenience of understanding. In FIGS. 2 and 3, the transparent semiconductor element 20 and sealing resin 40 are indicated by imaginary lines (two dot chain lines).

In the description of the semiconductor device A10, a thickness direction z of the conductive member 10 will be referred to as a "thickness direction z." A direction orthogonal to the thickness direction z will be referred to as a "first direction x." A direction orthogonal to both the thickness direction z and the first direction x will be referred to as a "second direction y." As illustrated in FIGS. 1 and 2, the semiconductor device A10 is rectangular as viewed in the thickness direction z. In addition, in the description of the semiconductor device A10, a side where a plurality of second leads 12 (details will be described later) are positioned in the second direction y will be referred to as "one side in the second direction y" for convenience. A side where a plurality of first leads 11 (details will be described later) are positioned in the second direction y will be referred to as "the other side in the second direction y."

As illustrated in FIG. 2, the conductive member 10 serves as a terminal for mounting the semiconductor element 20 thereon and for installing the semiconductor device A10 on a wiring board. As illustrated in FIGS. 9 to 12, a part of the conductive member 10 is covered by the sealing resin 40. The conductive member 10 includes a main surface 101 facing one side in the thickness direction z, and a back surface 102 facing the opposite side in the thickness direction z. The main surface 101 is facing the one side in the thickness direction z and is also facing the semiconductor element 20. The semiconductor element 20 is supported by the main surface 101. The main surface 101 is covered by the sealing resin 40. The back surface 102 is facing the other side in the thickness direction z. The conductive member 10 includes a single lead frame. The lead frame contains a material including, for example, copper (Cu) or a copper alloy. The conductive member 10 includes the plurality of first leads 11, the plurality of second leads 12, and a pair of third leads 13.

Figure 4:
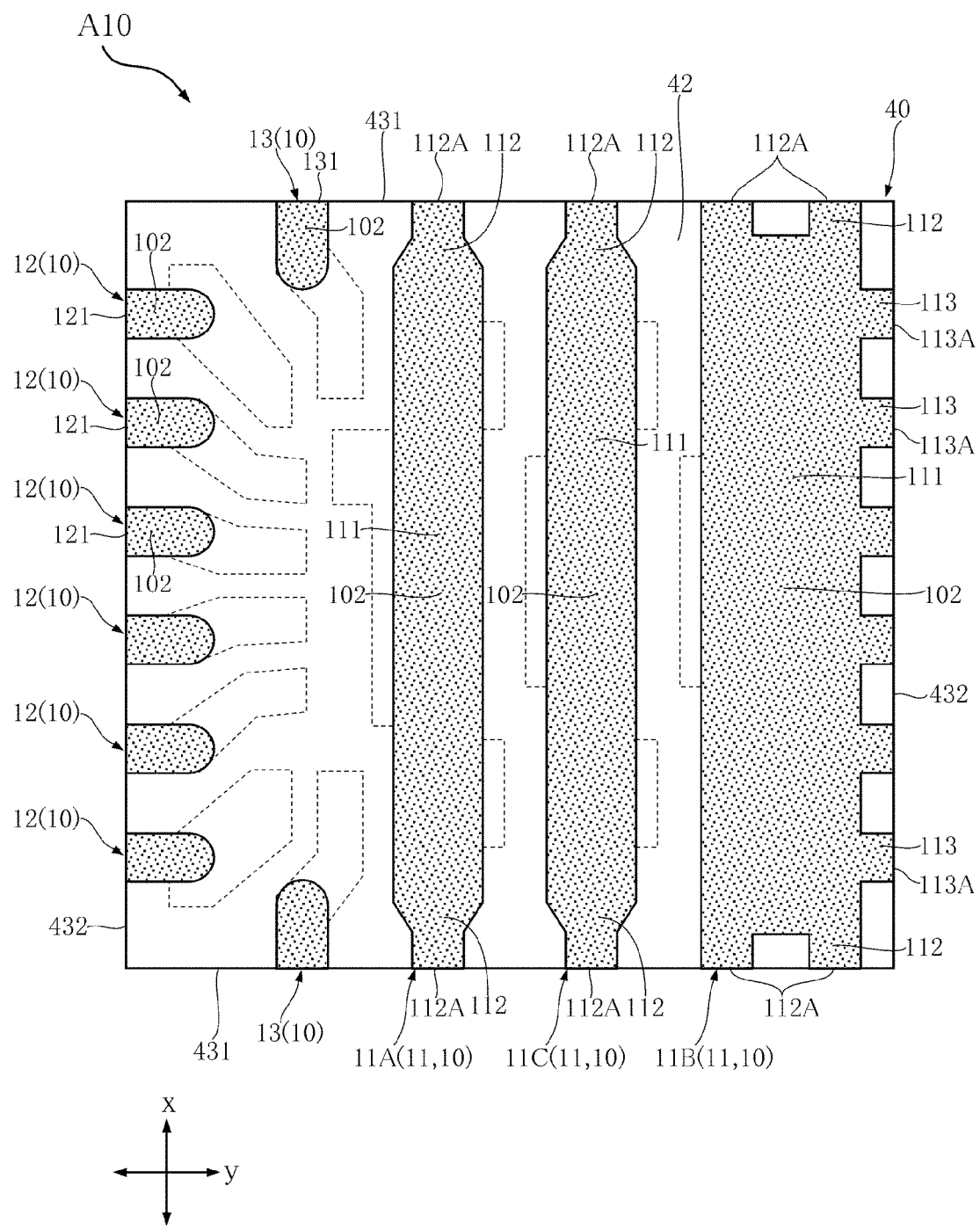
FIG. 4 is a bottom view of the semiconductor device illustrated in FIG. 1.

The plurality of first leads 11 have band shapes extending in the first direction x as viewed in the thickness direction z as illustrated in FIGS. 3 and 4. The plurality of first leads 11 are arranged in the second direction y. In the example of the semiconductor device A10, the plurality of first leads 11 include three terminals, that is, a first input terminal 11A, a second input terminal 11B, and an output terminal 11C. The first input terminal 11A, the output terminal 11C, and the second input terminal 11B of the plurality of first leads 11 are arrayed in this order from the one side to the other side in the second direction y. DC power (voltage) to be converted in the semiconductor device A10 is input to the first input terminal 11A and the second input terminal 11B. The first input terminal 11A is a positive terminal (P terminal). The second input terminal 11B is a negative terminal (N terminal). AC power (voltage) converted by the switching circuit 212A included in the semiconductor element 20 is output from the output terminal 11C.

As illustrated in FIG. 3, the first input terminal 11A is positioned between the plurality of second leads 12 and the output terminal 11C in the second direction y. The output terminal 11C is positioned between the first input terminal 11A and the second input terminal 11B in the second direction y. The first input terminal 11A and the output terminal 11C each include a main portion 111 and a pair of side portions 112. As illustrated in FIGS. 3 and 4, the main portion 111 extends in the first direction x. In the plurality of first leads 11, the semiconductor element 20 is supported by the main surface 101 of the main portion 111. The pair of side portions 112 are connected to both ends of the main portion 111 in the first direction x. As illustrated in FIGS. 3, 4, 10, and 11, each of the pair of side portions 112 includes a first end surface 112A. The first end surface 112A is connected to both the main surface 101 and the back surface 102 of the first lead 11 and is facing the first direction x. The first end surface 112A is exposed from the sealing resin 40.

As illustrated in FIGS. 3 and 4, the pair of side portions 112 become narrower in the second direction y in each of the first input terminal 11A and the output terminal 11C. Therefore, the dimension of each of the pair of first end surfaces 112A in the second direction y is smaller than the dimension of the main portion 111 in the second direction y in each of the first input terminal 11A and the output terminal 11C. Both ends of the pair of side portions 112 in the second direction y are in contact with the sealing resin 40.

Figure 9:
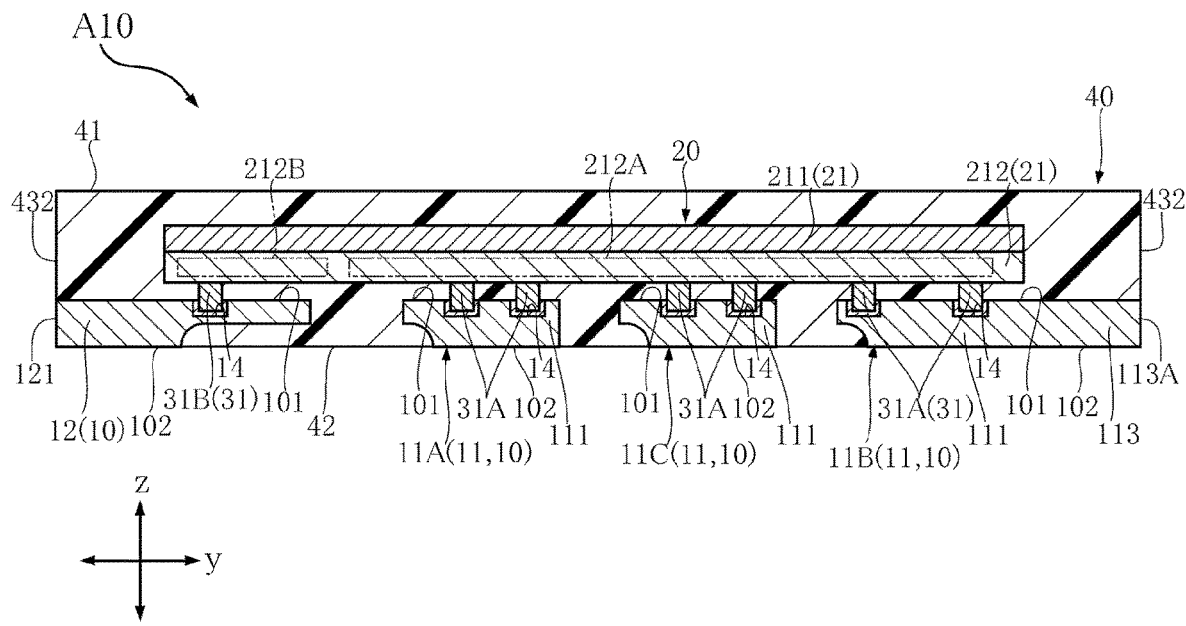
FIG. 9 is a cross-sectional view along a line IX-IX in FIG. 3.

As illustrated in FIG. 3, the second input terminal 11B is positioned on the other side in the second direction y with respect to the output terminal 11C. Therefore, the second input terminal 11B is the closest to the other side in the second direction y among the plurality of first leads 11. The second input terminal 11B includes the main portion 111, the pair of side portions 112, and a plurality of protrusion portions 113. The plurality of protrusion portions 113 protrude from the main portion 111 on the other side in the second direction y. The sealing resin 40 is provided between two adjacent protrusion portions 113. As illustrated in FIG. 9, each of the plurality of protrusion portions 113 includes a sub end surface 113A. The sub end surface 113A is connected to both the main surface 101 and the back surface 102 of the second input terminal 11B and is facing the other side in the second direction y. The sub end surface 113A is exposed from the sealing resin 40. As illustrated in FIG. 7, the plurality of sub end surfaces 113A are arrayed at predetermined intervals in the first direction x.

As illustrated in FIGS. 3 and 4, the area of the main surface 101 is larger than the area of the back surface 102 in each of the plurality of first leads 11. In the example of the semiconductor device A10, the area of the back surface 102 of the first input terminal 11A is equal to the area of the back surface 102 of the output terminal 11C. The area of the back surface 102 of the second input terminal 11B is larger than the area of the back surface 102 of each of the first input terminal 11A and the output terminal 11C.

In each of the first input terminal 11A, the second input terminal 11B, and the output terminal 11C, plating such as silver (Ag) plating may be applied to the main surface 101 of the main portion 111 that supports the semiconductor element 20. Further, in each of the first input terminal 11A, the second input terminal 11B, and the output terminal 11C, plating such as tin (Sn) plating may be applied to the back surface 102, the pair of first end surfaces 112A, and the plurality of sub end surfaces 113A that are exposed from the sealing resin 40. Noted that a plurality of types of metal plating such as metal plating in which nickel (Ni), palladium (Pd), and gold (Au) are layered in this order may be adopted instead of the tin plating.

The plurality of second leads 12 are positioned on the one side in the second direction y with respect to the plurality of first leads 11 as illustrated in FIG. 3. One of the plurality of second leads 12 is a ground terminal of the control circuit 212B included in the semiconductor element 20. Power (voltage) for driving the control circuit 212B or an electrical signal to be transmitted to the control circuit 212B is input to each of a plurality of second leads 12 other than the ground terminal. As illustrated in FIGS. 3, 4, and 9, each of the plurality of second leads 12 includes a second end surface 121. The second end surface 121 is connected to both the main surface 101 and the back surface 102 of the second lead 12 and is facing the one side in the second direction y. The second end surface 121 is exposed from the sealing resin 40. As illustrated in FIG. 8, the plurality of second end surfaces 121 are arrayed at predetermined intervals in the first direction x.

As illustrated in FIGS. 3 and 4, the area of the main surface 101 is larger than the area of the back surface 102 in each of the plurality of second leads 12. Note that the areas of the back surfaces 102 of the plurality of second leads 12 are all equal. Plating such as silver plating may be applied to the back surfaces 102 of the plurality of second leads 12 that support the semiconductor element 20. Further, plating such as tin plating may be applied to the back surfaces 102 and the second end surfaces 121 of the plurality of second leads 12 that are exposed from the sealing resin 40. Note that a plurality of types of metal plating such as metal plating in which nickel, palladium, and gold are layered in this order may be adopted instead of the tin plating.

Figure 12:
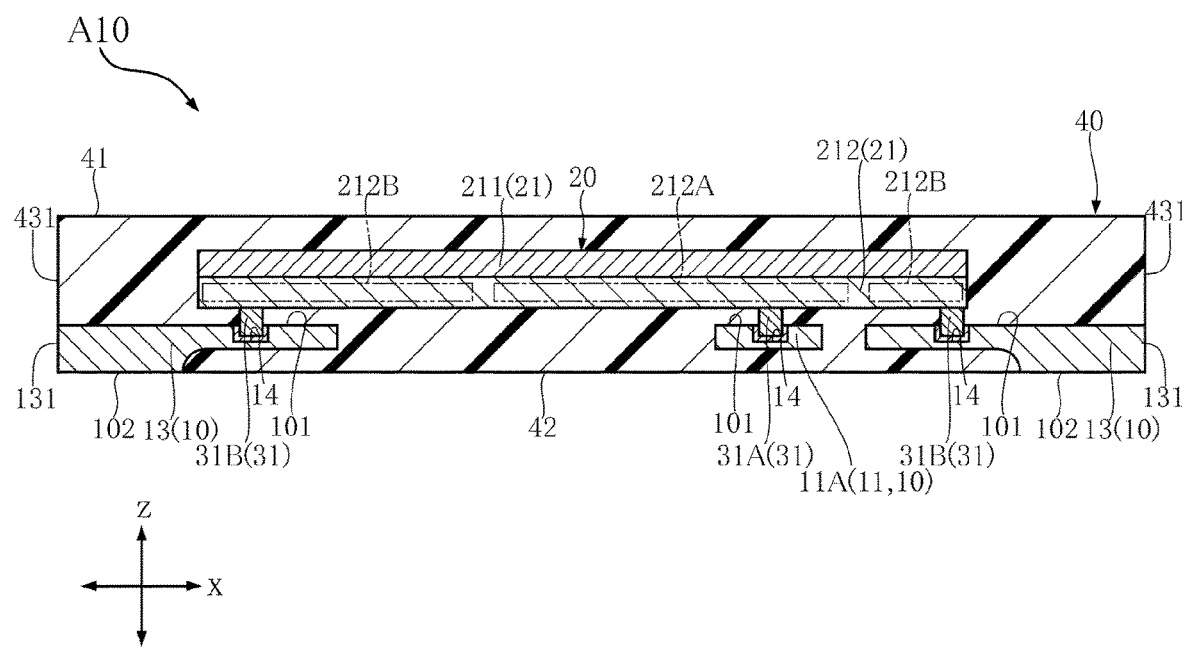
FIG. 12 is a cross-sectional view along a line XII-XII in FIG. 3.

The pair of third leads 13 are positioned between the first lead 11 (first input terminal 11A) and the plurality of second leads 12 in the second direction y as illustrated in FIG. 3. The pair of third leads 13 are separated from each other in the first direction x. An electrical signal or other signals to be transmitted to the control circuit 212B included in the semiconductor element 20 is input to each of the pair of third leads 13. As illustrated in FIGS. 3, 4, and 12, each of the pair of third leads 13 includes a third end surface 131. The third end surface 131 is connected to both the main surface 101 and the back surface 102 and is facing the first direction x. The third end surface 131 is exposed from the sealing resin 40. The third end surface 131 and the first end surfaces 112A of the plurality of first leads 11 are arrayed in the second direction y.

As illustrated in FIGS. 3 and 4, the area of the main surface 101 is larger than the area of the back surface 102 in each of the pair of third leads 13. Plating such as silver plating may be applied to the main surfaces 101 of the pair of third leads 13 that support the semiconductor element 20. Further, plating such as tin plating may be applied to the back surfaces 102 and the third end surfaces 131 of the pair of third leads 13 exposed from the sealing resin 40. Note that a plurality of types of metal plating such as metal plating in which nickel, palladium, and gold are layered in this order may be adopted instead of the tin plating.

Figure 13:
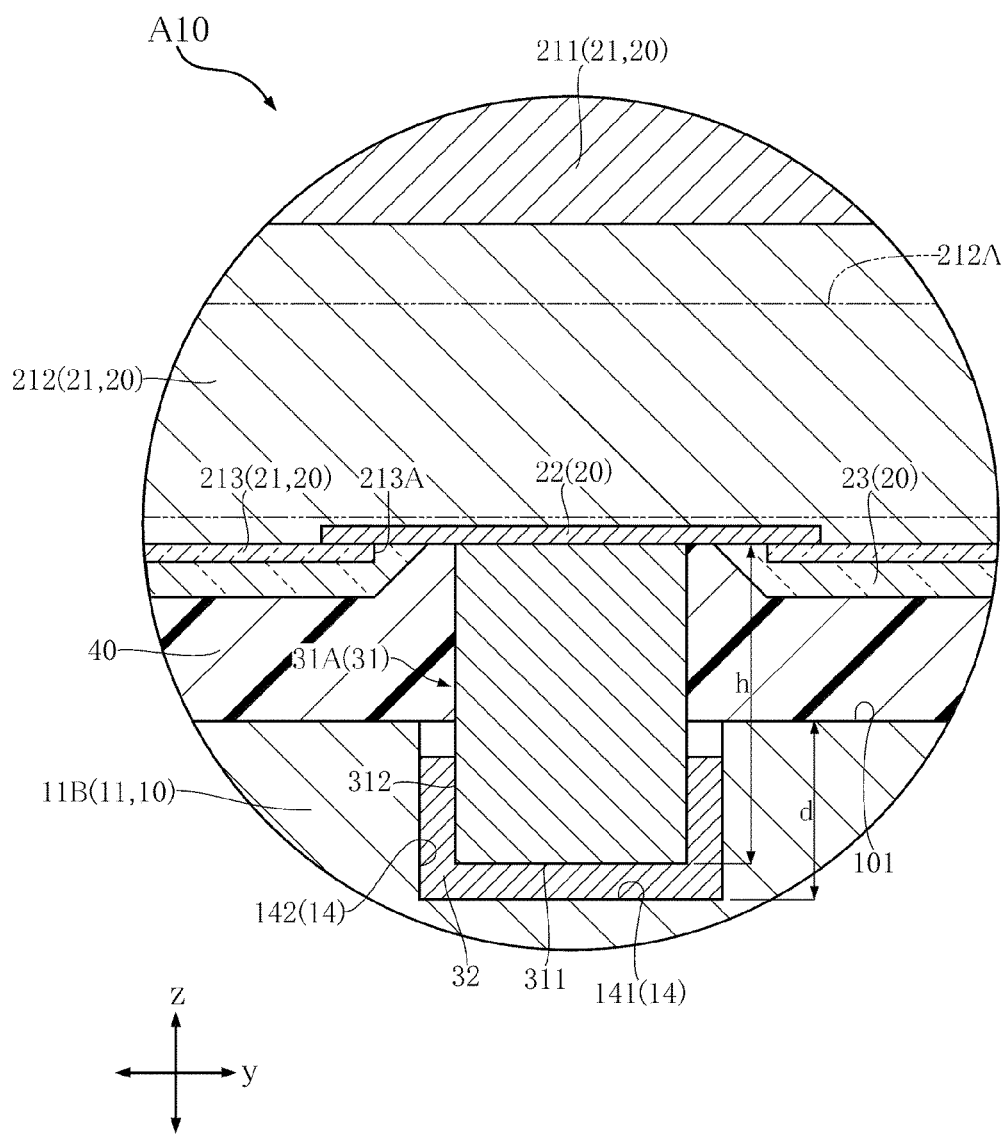
FIG. 13 is a partially enlarged view of FIG. 9.
Figure 14:
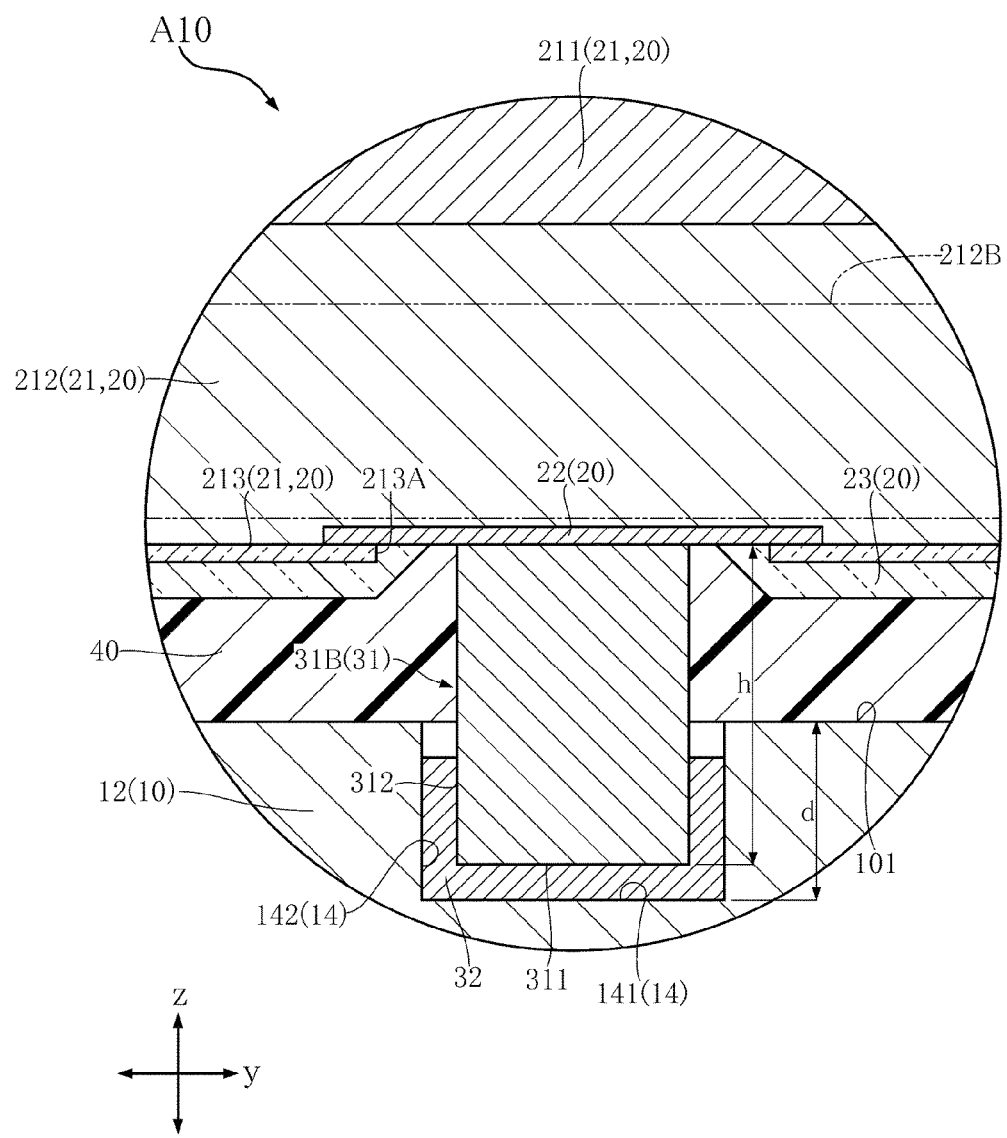
FIG. 14 is a partially enlarged view of FIG. 9.

As illustrated in FIGS. 3 and 9 to 12, the conductive member 10 includes a plurality of recessed portions 14. The plurality of recessed portions 14 are recessed in the thickness direction z from the main surface 101 of the conductive member 10. As illustrated in FIGS. 13 and 14, each of the plurality of recessed portions 14 includes a bottom surface 141 and an inner side surface 142. The bottom surface 141 faces the same side as the side that the main surface 101 is facing in the thickness direction z. The bottom surface 141 is positioned between the main surface 101 and the back surface 102 of the conductive member 10 in the thickness direction z. The inner side surface 142 is connected to the bottom surface 141 and the main surface 101. The inner side surface 142 is perpendicular to the bottom surface 141 in the semiconductor device A10.

The semiconductor element 20 is bonded to the conductive member 10 (the plurality of first leads 11, the plurality of second leads 12, and the pair of third leads 13) based on flip chip assembly through the plurality of electrodes 31 and the bonding layers 32 as illustrated in FIGS. 9 to 12. Each of the plurality of electrodes 31 and the bonding layer 32 provide a bonding portion. The semiconductor element 20 is covered by the sealing resin 40. As illustrated in FIGS. 13 and 14, the semiconductor element 20 includes an element body 21, a plurality of pads 22, and a surface protection film 23.

The element body 21 provides a main part of the semiconductor element 20. As illustrated in FIGS. 13 and 14, the element body 21 includes a substrate 211, a semiconductor layer 212, and a passivation film 213.

As illustrated in FIGS. 13 and 14, the substrate 211 supports, on the lower side thereof, the semiconductor layer 212, the passivation film 213, the plurality of electrodes 31, and the surface protection film 23. The substrate 211 contains a semiconductor material. The major component of the semiconductor material is, for example, silicon (Si) or silicon carbide (SiC). The thickness of the substrate 211 is, for example, equal to or greater than 100 μm but equal to or smaller than 300 μm.

As illustrated in FIGS. 9 to 12, with respective to the substrate 211, the semiconductor layer 212 is positioned so as to face the main surface 101 of the conductive member 10 in the thickness direction z. The semiconductor layer 212 is layered over the substrate 211. The semiconductor layer 212 includes a plurality of types of p-type semiconductors and n-type semiconductors based on the difference in amount of doped element. The semiconductor layer 212 includes the switching circuit 212A and the control circuit 212B that is electrically connected to the switching circuit 212A. The switching circuit 212A is, for example, a metal-oxide-semiconductor field-effect transistor (MOSFET) or an insulated gate bipolar transistor (IGBT). In the example of the semiconductor device A10, the switching circuit 212A is divided into two regions, that is, a high voltage region (upper arm circuit) and a low voltage region (lower arm circuit). Each of the regions includes one n channel MOSFET. The control circuit 212B includes, for example, a gate driver that drives the switching circuit 212A, and a bootstrap circuit corresponding to the high voltage region of the switching circuit 212A. The control circuit 212B controls the switching circuit 212A such that the switching circuit 212A is driven correctly. Note that the semiconductor layer 212 includes a wiring layer (not illustrated). The switching circuit 212A and the control circuit 212B are electrically connected to each other through the wiring layer.

As illustrated in FIGS. 13 and 14, the passivation film 213 covers a lower surface of the semiconductor layer 212. The passivation film 213 is electrically insulated. The passivation film 213 includes, for example, a silicon oxide film ($SiO_2$) in contact with the lower surface of the semiconductor layer 212 and a silicon nitride film (Si$_3$N$_4$) layered on the silicon oxide film. The passivation film 213 is provided with a plurality of openings 213A penetrating in the thickness direction z.

As illustrated in FIGS. 13 and 14, the plurality of pads 22 are facing the main surface 101 of the conductive member 10. The plurality of pads 22 are arranged in contact with the semiconductor layer 212 of the element body 21. As a result, each of the plurality of pads 22 is electrically connected to either the switching circuit 212A of the semiconductor layer 212 or the control circuit 212B of the semiconductor layer 212. Each of the plurality of pads 22 contains aluminum (Al) or copper in the composition. Alternatively, each of the plurality of pads 22 may include a plurality of metal layers in which copper, nickel, and palladium are sequentially layered downward from the semiconductor layer 212. Each of the plurality of pads 22 is in contact with the passivation film 213 of the element body 21. Each of the plurality of pads 22 is partially exposed from the opening 213A of the passivation film 213.

As illustrated in FIGS. 13 and 14, the surface protection film 23 covers the passivation film 213 of the element body 21. The surface protection film 23 is in contact with the passivation film 213 and the plurality of pads 22. In the semiconductor device A10, each of the plurality of electrodes 31 is separated from the surface protection film 23. Instead of this configuration, each of the plurality of electrodes 31 may be in contact with the surface protection film 23. The surface protection film 23 is electrically insulated. The surface protection film 23 contains, for example, a material including polyimide.

The plurality of electrodes 31 are formed on the plurality of pads 22 of the semiconductor element 20 as illustrated in FIGS. 13 and 14. The plurality of electrodes 31 protrude in the thickness direction z from the plurality of pads 22 toward the side opposite to the side where the element body 21 of the semiconductor element 20 is provided. As illustrated in FIGS. 9 to 12, the plurality of electrodes 31 are separately inserted into the plurality of recessed portions 14 of the conductive member 10. In the semiconductor device A10, the composition of each of the plurality of electrodes 31 contains copper.

Each of the plurality of electrodes 31 is electrically connected to either the switching circuit 212A of the semiconductor layer 212 or the control circuit 212B of the semiconductor layer 212 through corresponding one of the plurality of pads 22 of the semiconductor element 20. Each of the plurality of electrodes 31 is bonded to the conductive member 10 through the bonding layer 32. The plurality of electrodes 31 include a plurality of first electrodes 31A and a plurality of second electrodes 31B. Each of the plurality of first electrodes 31A is electrically connected to the switching circuit 212A of the semiconductor layer 212 and is bonded to corresponding one of the plurality of first leads 11. Each of the plurality of second electrodes 31B is electrically connected to the control circuit 212B of the semiconductor layer 212 and is bonded to corresponding one of the plurality of second leads 12 or corresponding one of the pair of third leads 13.

As illustrated in FIGS. 13 and 14, each of the plurality of electrodes 31 includes an opposing surface 311 and an outer side surface 312. The opposing surface 311 is facing the bottom surface 141 of corresponding one of the plurality of recessed portions 14. The outer side surface 312 is connected to the opposing surface 311 and is facing the inner side surface 142 of corresponding one of the plurality of recessed portions 14.

The bonding layers 32 are arranged in the plurality of recessed portions 14 of the conductive member 10 as illustrated in FIGS. 13 and 14. The conductive member 10 and the plurality of electrodes 31 are bonded through the bonding layers 32. The bonding layer 32 is conductive. The bonding layer 32 contains metal in the semiconductor device A10. The composition of the metal contains tin. The bonding layer 32 is, for example, lead free solder.

As illustrated in FIGS. 13 and 14, the bonding layers 32 are in contact with the bottom surfaces 141 of the plurality of recessed portions 14 of the conductive member 10 and the opposing surfaces 311 of the plurality of electrodes 31. The bonding layers 32 are also in contact with the inner side surfaces 142 of the plurality of recessed portions 14 and the outer side surfaces 312 of the plurality of electrodes 31. A height h of each of the plurality of electrodes 31 is larger than a depth d of each of the plurality of recessed portions 14.

The sealing resin 40 is in contact with the main surface 101 of the conductive member 10 and covers the semiconductor element 20 and the plurality of electrodes 31 as illustrated in FIGS. 9 to 12. The sealing resin 40 has a part provided between the main surface 101 and the semiconductor element 20. As illustrated in FIGS. 5 to 8, the sealing resin 40 includes a top surface 41, a bottom surface 42, a pair of first side surfaces 431, and a pair of second side surfaces 432. The sealing resin 40 contains, for example, a material including a black epoxy resin.

As illustrated in FIGS. 9 to 12, the top surface 41 faces the same side as the side that the main surface 101 of the conductive member 10 is facing in the thickness direction z. As illustrated in FIGS. 5 to 8, the bottom surface 42 faces the side opposite to the side that the top surface 41 is facing. As illustrated in FIG. 4, the back surfaces 102 of the plurality of first leads 11, the back surfaces 102 of the plurality of second leads 12, and the back surfaces 102 of the pair of third leads 13 are exposed from the bottom surface 42.

Figure 10:
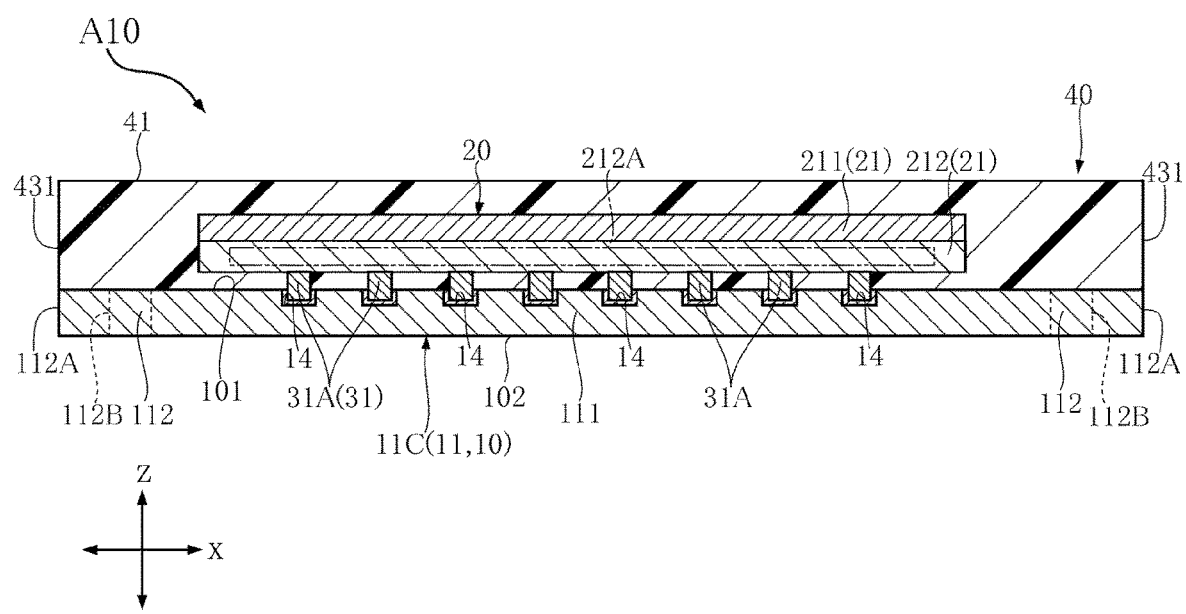
FIG. 10 is a cross-sectional view along a line X-X in FIG. 3.
Figure 11:
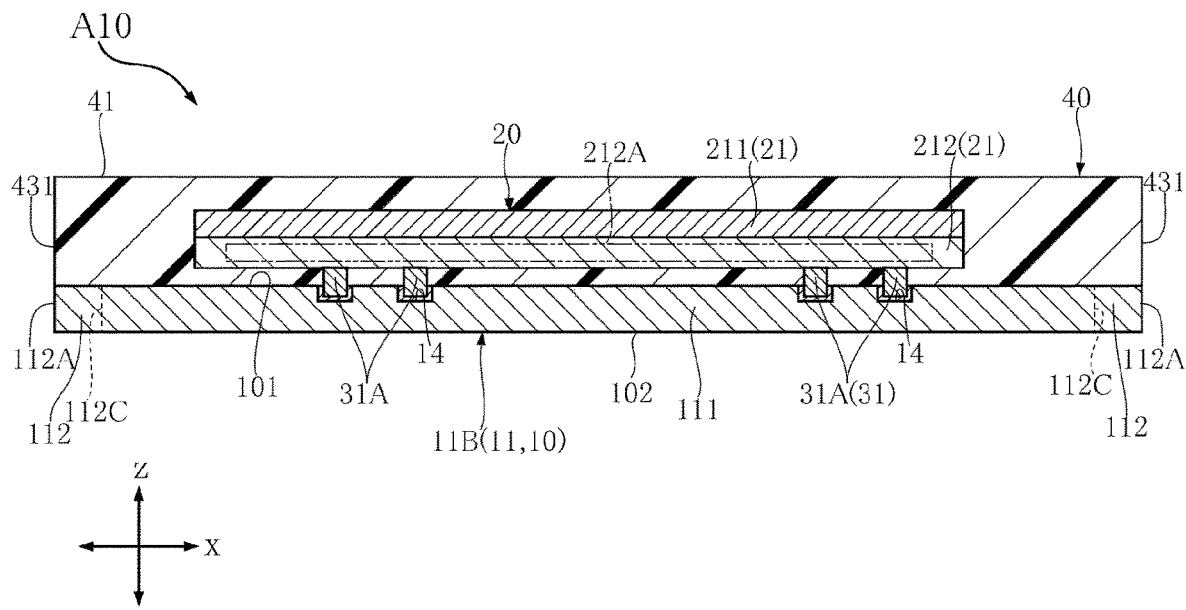
FIG. 11 is a cross-sectional view along a line XI-XI in FIG. 3.

As illustrated in FIGS. 7 and 8, the pair of first side surfaces 431 are connected to both the top surface 41 and the bottom surface 42 and are facing the first direction x. The pair of first side surfaces 431 are separated from each other in the first direction x. As illustrated in FIGS. 10 to 12, the first end surfaces 112A of the plurality of first leads 11 and the third end surface 131 of the third lead 13 are exposed from each of the pair of first side surfaces 431 such that the first end surfaces 112A and the third end surface 131 are flush with the first side surface 431.

Figure 5:
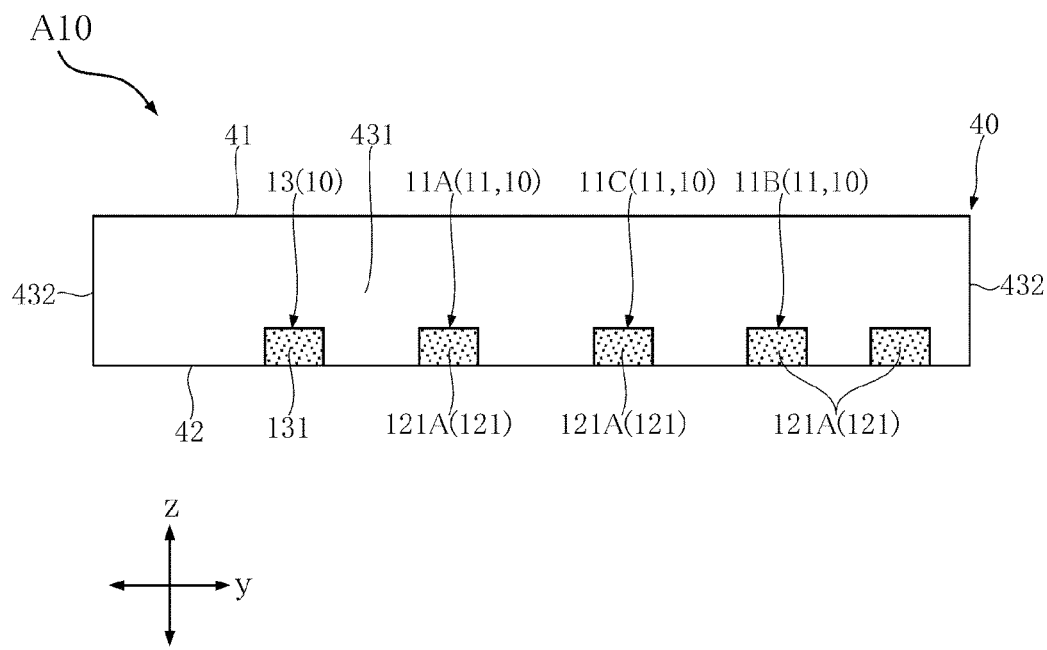
FIG. 5 is a front view of the semiconductor device illustrated in FIG. 1.
Figure 6:
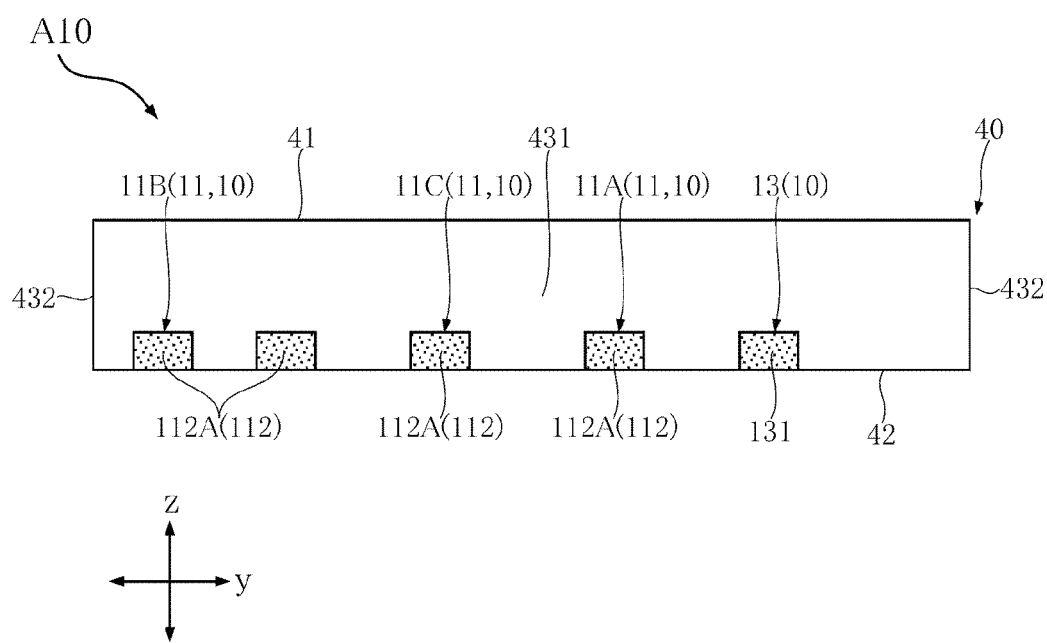
FIG. 6 is a back view of the semiconductor device illustrated in FIG. 1.

As illustrated in FIGS. 5 and 6, the pair of second side surfaces 432 are connected to the top surface 41, the bottom surface 42, and the pair of first side surfaces 431 and are facing the second direction y. The pair of second side surfaces 432 are separated from each other in the second direction y. As illustrated in FIG. 9, the second end surfaces 121 of the plurality of second leads 12 are exposed from the second side surface 432 positioned on the one side in the second direction y such that the second end surfaces 121 are flush with the second side surface 432. The plurality of sub end surfaces 113A of the second input terminal 11B (first lead 11) are exposed from the second side surface 432 positioned on the other side in the second direction y such that the plurality of sub end surfaces 113A are flush with the second side surface 432.

<First Modification>

A semiconductor device A11 as a modification of the semiconductor device A10 will be described with reference to FIG. 15. Here, the cross section position of FIG. 15 is the same as the cross section position of FIG. 13.

Figure 15:
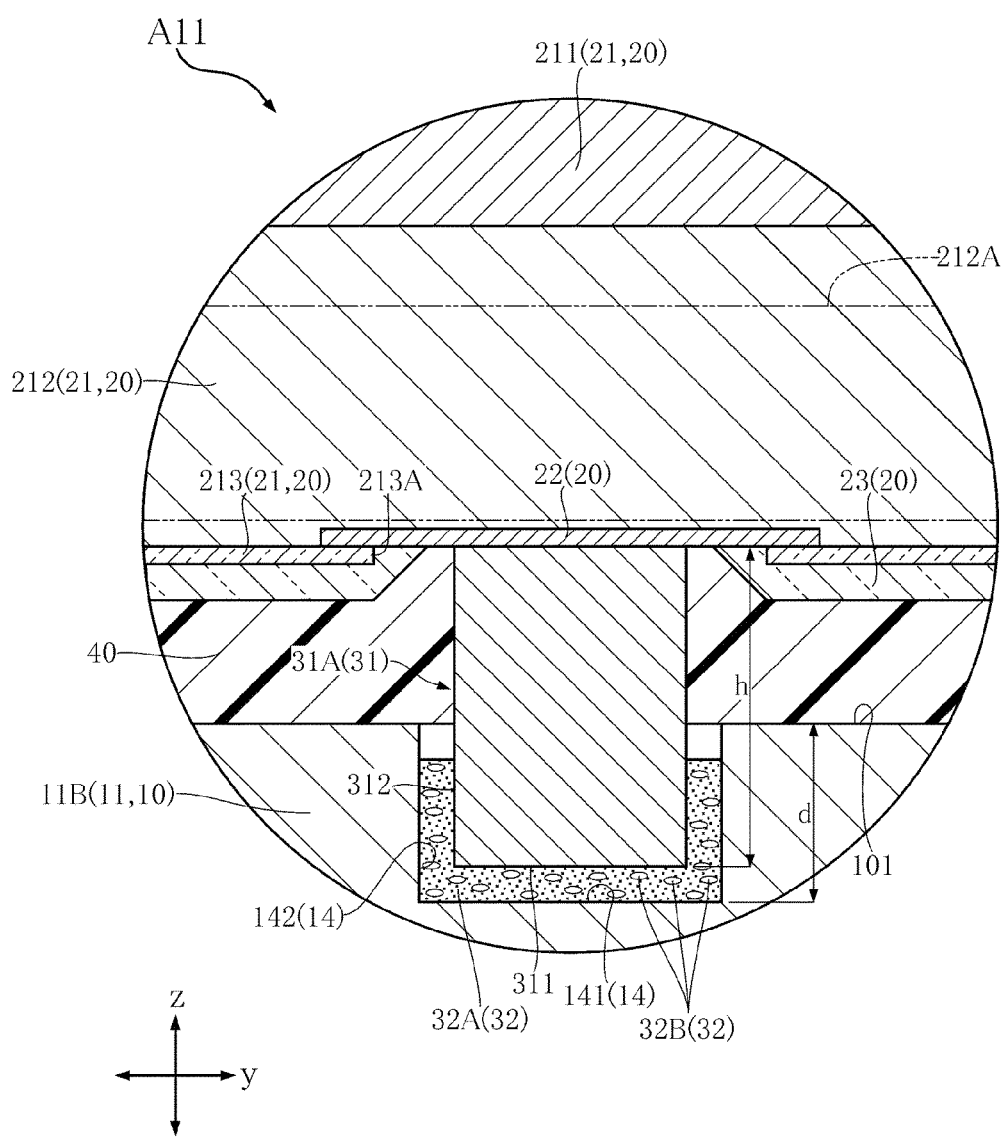
FIG. 15 is a partially enlarged cross-sectional view of a first modification of the semiconductor device illustrated in FIG. 1.

As illustrated in FIG. 15, the configuration of the bonding layer 32 in the semiconductor device A11 is different from the configuration in the semiconductor device A10. In the semiconductor device A11, the bonding layer 32 includes a metal portion 32A and an insulating portion 32B. The metal portion 32A is a connected body of sintered metal particles, that is, a sintered body. The composition of the sintered body contains silver. The sintered body is formed by firing the metal particles under atmospheric pressure. Alternatively, the metal portion 32A may include metal particles not fired. The composition of the metal particles contains silver. The insulating portion 32B is a part of the bonding layer 32 excluding the metal portion 32A. At least a part of the insulating portion 32B contains a resin. The resin contains a material including a synthetic resin as a binder. The synthetic resin is a thermosetting resin such as an epoxy resin. The Young's modulus of the resin is smaller than the Young's modulus of the metal portion 32A. The insulating portion 32B may contain only a resin or may contain a mixture of a resin and air gaps. The volume of the insulating portion 32B is equal to or greater than 15% but equal to or smaller than 35% of the volume of the entire bonding layer 32.

<Second Modification>

A semiconductor device A12 as a modification of the semiconductor device A10 will be described with reference to FIG. 16. Here, the cross section position of FIG. 16 is the same as the cross section position of FIG. 13.

Figure 16:
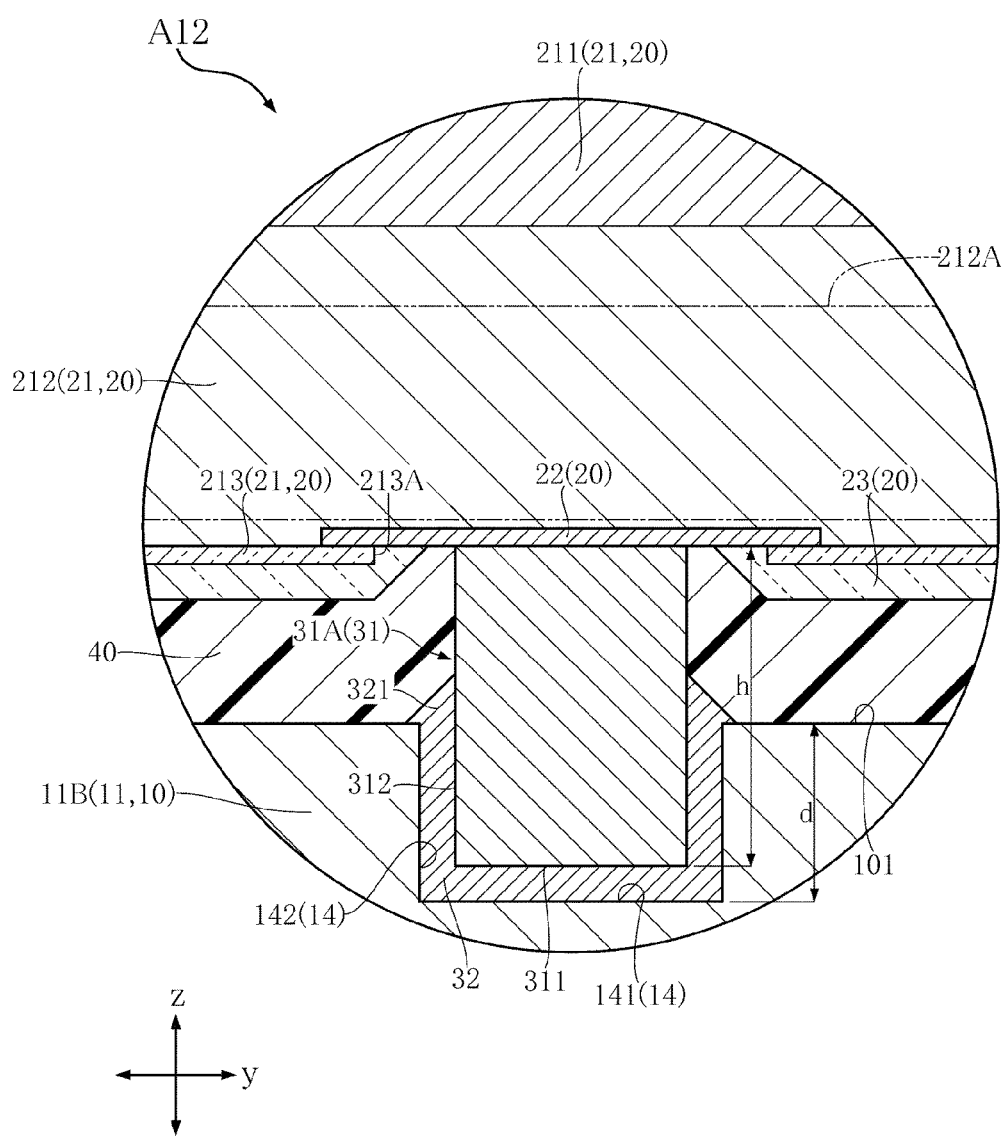
FIG. 16 is a partially enlarged cross-sectional view of a second modification of the semiconductor device illustrated in FIG. 1.

As illustrated in FIG. 16, the configuration of the bonding layer 32 in the semiconductor device A12 is different from the configuration in the semiconductor device A10. In the semiconductor device A12, the bonding layer 32 includes a protrusion portion 321. The protrusion portion 321 is positioned outside of each of the plurality of recessed portions 14 of the conductive member 10. The protrusion portion 321 is in contact with the outer side surface 312 of each of the plurality of electrodes 31 and the main surface 101 of the conductive member 10.

Next, an action and an effect of the semiconductor device A10 will be described.

The semiconductor device A10 includes the conductive member 10 including the plurality of recessed portions 14 recessed in the thickness direction z from the main surface 101; and the plurality of electrodes 31 protruding in the thickness direction z from the plurality of pads 22 of the semiconductor element 20. The plurality of electrodes 31 are separately inserted into the plurality of recessed portions 14. The semiconductor device A10 further includes the bonding layer 32 that is conductive and that is arranged in each of the plurality of recessed portions 14. The conductive member 10 and the plurality of electrodes 31 are bonded through the bonding layers 32. This configuration suppresses the expansion of the bonding layer 32 along the main surface 101 of the conductive member 10 in a step of bonding the plurality of electrodes 31 to the conductive member 10 through the bonding layers 32 in the manufacturing process of the semiconductor device A10, and therefore, the configuration prevents the short circuit of the plurality of electrodes 31. Further, in each of the plurality of recessed portions 14, the bonding layer 32 is restricted by the conductive member 10 and corresponding one of the plurality of electrodes 31, and this reduces the thermal strain of the bonding layer 32 caused by the heat generated from the semiconductor element 20. As a result, the generation of a crack in the bonding layer 32 can be suppressed. Therefore, according to the semiconductor device A10, the short circuit of the plurality of electrodes 31 can be prevented, and the generation of a crack in the bonding layer 32 can be suppressed.

The bonding layers 32 are in contact with the bottom surfaces 141 of the plurality of recessed portions 14 of the conductive member 10 and the opposing surfaces 311 of the plurality of electrodes 31. The bonding layers 32 are also in contact with the inner side surfaces 142 of the plurality of recessed portions 14 and the outer side surfaces 312 of the plurality of electrodes 31. This can improve the bond strength of the plurality of electrodes 31 with respect to the conductive member 10.

In the semiconductor device A11, the bonding layer 32 includes the metal portion 32A and the insulating portion 32B. The metal portion 32A is a sintered body. At least a part of the insulating portion 32B contains a resin. In this case, the Young's modulus of the insulating portion 32B can be set to a Young's modulus smaller than the Young's modulus of the metal portion 32A to effectively reduce the thermal stress applied to the metal portion 32A and caused by the heat generated from the semiconductor element 20. This contributes to the suppression of the generation of a crack in the metal portion 32A.

In the semiconductor device A11, it is preferable that the volume of the insulating portion 32B of the bonding layer 32 be equal to or greater than 15% but equal to or smaller than 35% of the volume of the entire bonding layer 32. This sufficiently fulfills the reduction effect of the thermal stress applied to the metal portion 32A of the bonding layer 32. On the other hand, when the volume of the insulating portion 32B is smaller than 15% of the volume of the entire bonding layer 32, it is difficult to fulfill the reduction effect of the thermal stress applied to the metal portion 32A. Further, when the volume of the insulating portion 32B exceeds 35% of the volume of the entire bonding layer 32, the electrical resistance of the bonding layer 32 may be increased, and this is not preferable.

In the semiconductor device A12, the bonding layer 32 includes the protrusion portion 321. The protrusion portion 321 is positioned outside of each of the plurality of recessed portions 14 of the conductive member 10. The protrusion portion 321 is in contact with the outer side surface 312 of each of the plurality of electrodes 31 and the main surface 101 of the conductive member 10. Because of the existence of the protrusion portion 321, the bonding layer 32 is provided in each of the plurality of recessed portions 14 of the conductive member 10. This means that the bond state of the plurality of electrodes 31 with respect to the conductive member 10 is favorable. Further, the size of the protrusion portion 321 can be appropriately adjusted to surely prevent the short circuit of the plurality of electrodes 31.

The semiconductor device A10 further includes the sealing resin 40 that is in contact with the main surface 101 of the conductive member 10 and that covers the semiconductor element 20 and the plurality of electrodes 31. The sealing resin 40 includes the part provided between the main surface 101 and the semiconductor element 20. This can improve the dielectric strength of the semiconductor device A10. To attain this configuration, it is preferable that the height h of each of the plurality of electrodes 31 be larger than the depth d of each of the plurality of recessed portions 14 of the conductive member 10 as illustrated in FIGS. 13 and 14. The reason is that this surely provides a gap between the main surface 101 and the semiconductor element 20 in the thickness direction z. The plurality of recessed portions 14 also serve as portions for suppressing the displacement of the positions of the plurality of electrodes 31 with respect to the conductive member 10 in manufacturing the semiconductor device A10.

The length of each of the plurality of electrodes 31 is smaller than the length of the bonding wire, and the lateral cross-sectional area of each of the plurality of electrodes 31 is larger than the lateral cross-sectional area of the bonding wire. Therefore, the parasitic resistance between the first lead 11 and the switching circuit 212A can be smaller than that in a case where the first lead 11 and the plurality of pads 22 of the semiconductor element 20 are connected through the bonding wire. The reduction in parasitic resistance can obtain an effect of reducing the on-resistance and the noise in the switching circuit 212A.

The switching circuit 212A is provided on the semiconductor layer 212 of the element body 21 of the semiconductor element 20. At least one of the plurality of electrodes 31 is electrically connected to the switching circuit 212A. The back surfaces 102 of the plurality of first leads 11 included in the conductive member 10 and bonded to at least one of the plurality of electrodes 31 are exposed from the bottom surface 42 of the sealing resin 40. Therefore, the heat generated from the semiconductor element 20 due to the drive of the switching circuit 212A can efficiently be released to the outside in using the semiconductor device A10.

Each of the plurality of first leads 11 includes the main portion 111 extending in the first direction x and the pair of side portions 112 connected to both ends of the main portion 111 in the first direction x. Each of the pair of side portions 112 includes the first end surface 112A that is facing the first direction x and that is exposed from the first side surface 431 of the sealing resin 40. Each of the pair of first end surfaces 112A is flush with the first side surface 431. A dimension b of each of the pair of first end surfaces 112A is smaller than a dimension B of the back surface 102 of the main portion 111 in the second direction y. Therefore, the area of each of the pair of first end surfaces 112A can be smaller than that of an existing QFN semiconductor device. This suppresses the generation of metal burrs in the pair of first end surfaces 112A during blade dicing in manufacturing the semiconductor device A10. The suppression of the generation of the metal burrs allows to assemble the semiconductor device A10 on the wiring board more easily.

As illustrated in FIGS. 3 and 4, the pair of side portions 112 become narrower in the second direction y in each of the plurality of first leads 11 (first input terminal 11A and output terminal 11C). Therefore, the dimension of each of the pair of first end surfaces 112A in the second direction y is smaller than the dimension of the main portion 111 in the second direction y in each of the first input terminal 11A and the output terminal 11C. Both ends of the pair of side portions 112 in the second direction y are in contact with the sealing resin 40. This configuration can prevent the plurality of first leads 11 from coming out from the pair of first side surfaces 431 of the sealing resin 40.

The second input terminal 11B includes the plurality of protrusion portions 113 protruding from the main portion 111 on the other side in the second direction y. Each of the plurality of protrusion portions 113 includes the sub end surface 113A facing the second direction y. The plurality of sub end surfaces 113A are exposed from the second side surface 432 of the sealing resin 40 positioned on the other side in the second direction y. Therefore, the second input terminal 11B is in contact with the sealing resin 40 on the other side in the second direction y. This can prevent the second input terminal 11B from coming out from the second side surface 432 positioned on the other side in the second direction y.

In each of the plurality of first leads 11, the area of the main surface 101 is larger than the area of the back surface 102. Therefore, the plurality of first leads 11 are in contact with the sealing resin 40 on the side that the back surfaces 102 are facing in the thickness direction z. This can prevent the plurality of first leads 11 from coming out from the bottom surface 42 of the sealing resin 40. This can also increase the area of the main surface 101 of each of the plurality of first leads 11 bonded to at least one of the plurality of electrodes 31. Therefore, the number of electrodes 31 bonded to the plurality of first leads 11 can be increased.

The conductive member 10 further includes the plurality of second leads 12 each bonded to at least one of the plurality of electrodes 31. In each of the plurality of second leads 12, the area of the main surface 101 is larger than the area of the back surface 102. This can prevent the plurality of second leads 12 from coming out from the bottom surface 42 of the sealing resin 40, as in the relation between the main surface 101 and the back surface 102 of the first lead 11 described above. This can also increase the area of each of the plurality of second leads 12 bonded to at least one of the plurality of electrodes 31. Therefore, the number of electrodes 31 bonded to the plurality of second leads 12 can be increased.

Second Embodiment

Figure 17:
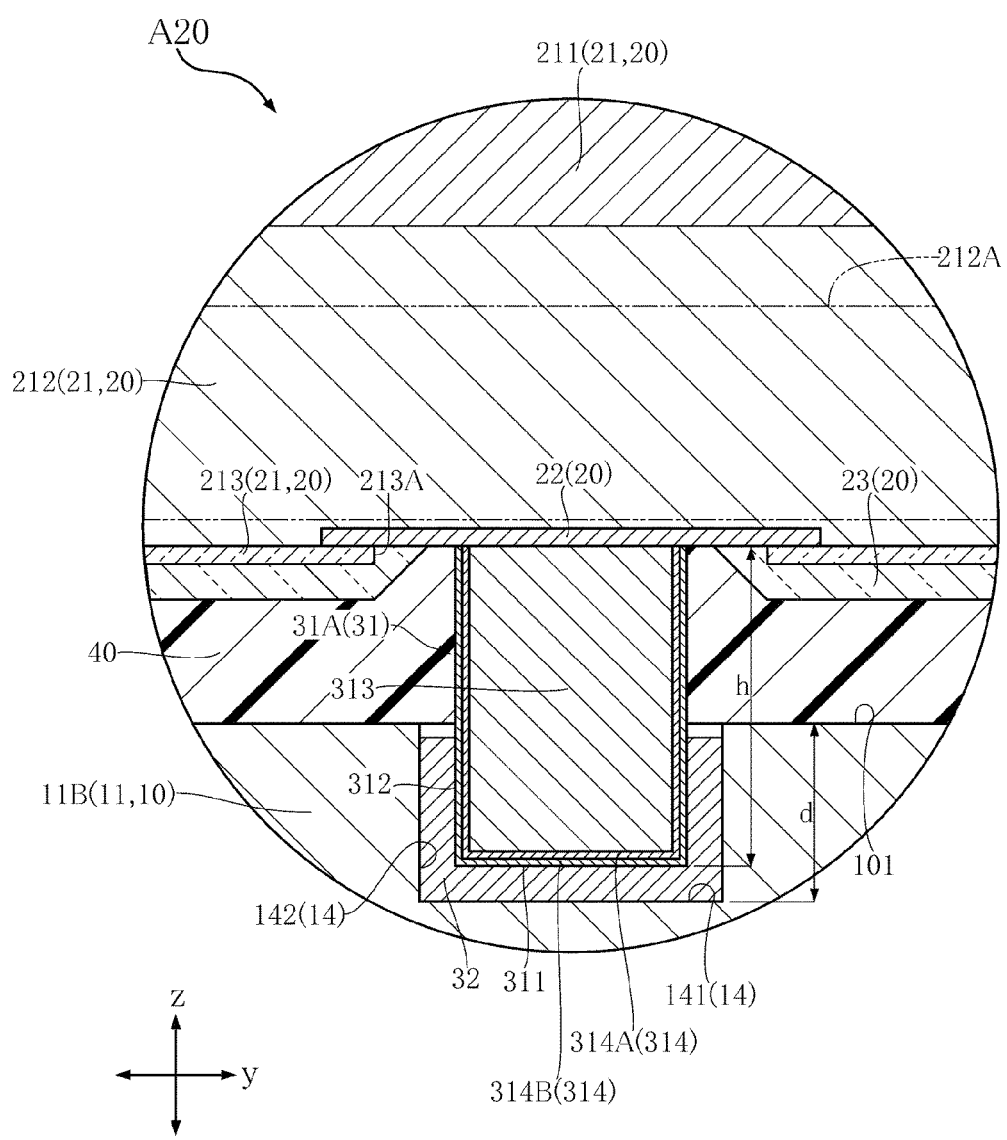
FIG. 17 is a partially enlarged cross-sectional view of a semiconductor device according to a second embodiment of the present disclosure.

A semiconductor device A20 according to a second embodiment of the present disclosure will be described with reference to FIG. 17. In FIG. 17, the same elements as or similar elements to those of the semiconductor device A10 are denoted by the same reference signs, and the description thereof will not be repeated. Here, the cross section position of FIG. 17 is the same as the cross section position of FIG. 13.

The configuration of the plurality of electrodes 31 in the semiconductor device A20 is different from the configuration in the semiconductor device A10.

As illustrated in FIG. 17, each of the plurality of electrodes 31 includes a main portion 313 and a sub portion 314. The main portion 313 is formed on the pad 22 of the semiconductor element 20. The composition of the main portion 313 contains copper. The sub portion 314 covers the main portion 313. The sub portion 314 includes a first layer 314A and a second layer 314B. The first layer 314A covers the main portion 313. The composition of the first layer 314A contains nickel. The second layer 314B covers the first layer 314A. The composition of the second layer 314B contains palladium. The sub portion 314 may include a single metal layer instead of the first layer 314A and the second layer 314B. In that case, the composition of the metal layer contains either palladium or nickel.

<Modification>

Next, a semiconductor device A21 as a modification of the semiconductor device A20 will be described with reference to FIG. 18. Here, the cross section position of FIG. 18 is the same as the cross section position of FIG. 13.

Figure 18:
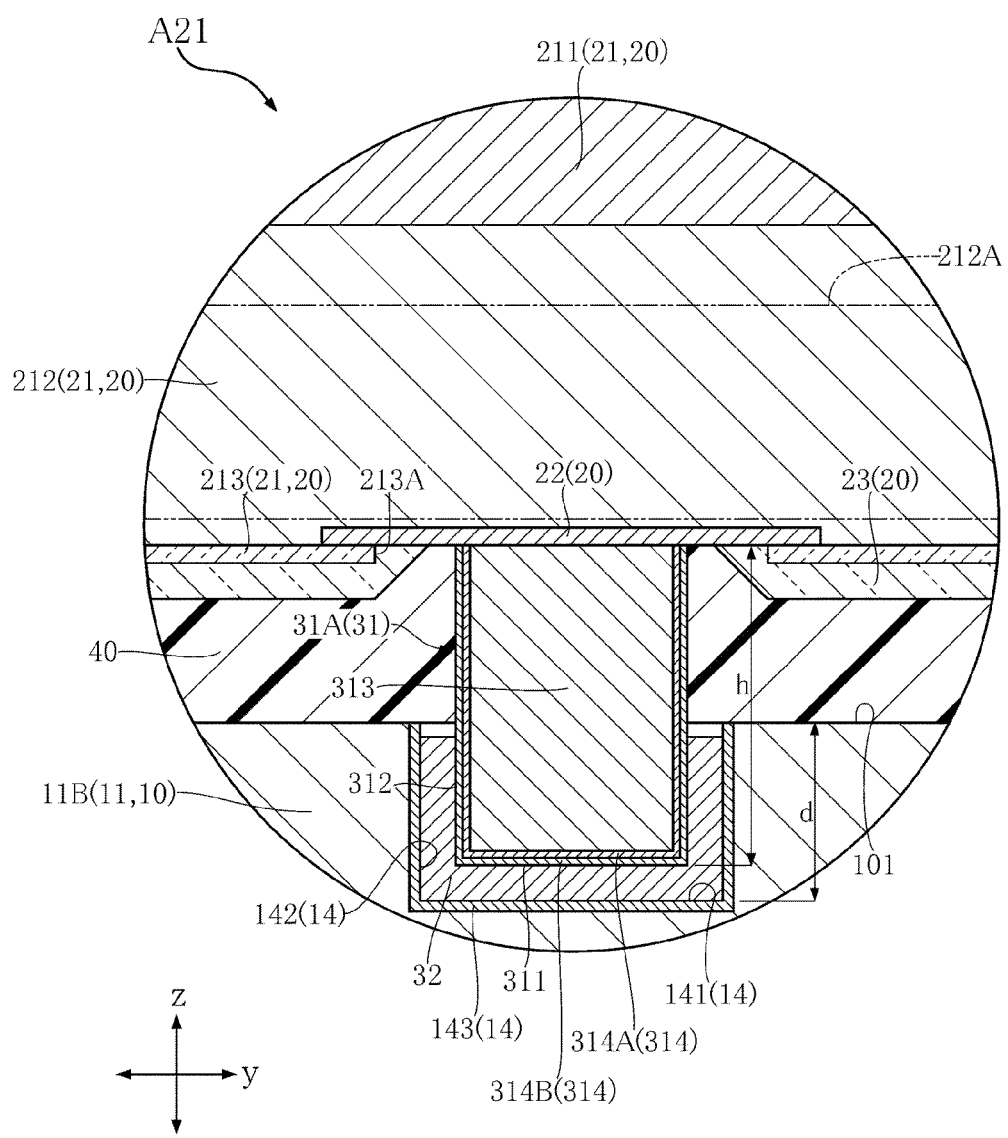
FIG. 18 is a partially enlarged cross-sectional view of a modification of the semiconductor device illustrated in FIG. 17.

As illustrated in FIG. 18, the configuration of the plurality of recessed portions 14 of the conductive member 10 in the semiconductor device A21 is different from the configuration in the semiconductor device A20. In the semiconductor device A21, each of the plurality of recessed portions 14 includes a covering layer 143. The covering layer 143 is a metal layer covering the conductive member 10 in each of the plurality of recessed portions 14. In each of the plurality of recessed portions 14, the bottom surface 141 and the inner side surface 142 provide the surface of the covering layer 143. The covering layer 143 includes a single metal layer or a plurality of metal layers. When the covering layer 143 includes a single metal layer, the composition of the metal layer contains either palladium or nickel. When the covering layer 143 includes a plurality of metal layers, the covering layer 143 includes a metal layer covering the conductive member 10 and containing nickel in the composition; and a metal layer covering the metal layer and containing palladium in the composition.

Next, an action and an effect of the semiconductor device A20 will be described.

The semiconductor device A20 includes the conductive member 10 including the plurality of recessed portions 14 recessed in the thickness direction z from the main surface 101; and the plurality of electrodes 31 protruding in the thickness direction z from the plurality of pads 22 of the semiconductor element 20. The plurality of electrodes 31 are separately inserted into the plurality of recessed portions 14. The semiconductor device A20 further includes the bonding layer 32 that is conductive and that is arranged in each of the plurality of recessed portions 14. The conductive member 10 and the plurality of electrodes 31 are bonded through the bonding layers 32. Therefore, the semiconductor device A20 can also prevent the short circuit of the plurality of electrodes 31 and suppress the generation of a crack in the bonding layer 32.

In the semiconductor device A20, each of the plurality of electrodes 31 includes the main portion 313 formed on the pad 22 of the semiconductor element 20; and the sub portion 314 covering the main portion 313. The composition of the main portion 313 contains copper. The composition of the sub portion 314 contains palladium. According to the configuration, the sub portion 314 reduces the thermal shock applied to the main portion 313 in the step of bonding the plurality of electrodes 31 to the conductive member 10 through the bonding layers 32 in the manufacturing process of the semiconductor device A20. This can protect the main portion 313. Further, the wettability of the bonding layer 32 with respect to the plurality of electrodes 31 is favorable when the composition of the bonding layer 32 contains tin. This sufficiently secures the contact area of the plurality of electrodes 31 with respect to the bonding layer 32. To fulfill the action more effectively, it is preferable that the sub portion 314 include the first layer 314A covering the main portion 313 and containing nickel in the composition; and the second layer 314B covering the first layer 314A and containing palladium in the composition.

In the semiconductor device A21, each of the plurality of recessed portions 14 of the conductive member 10 includes the covering layer 143. This configuration can reduce the thermal shock applied to the conductive member 10 in the step of bonding the plurality of electrodes 31 to the conductive member 10 through the bonding layers 32 in the manufacturing process of the semiconductor device A20. Therefore, the conductive member 10 can be protected. Further, the wettability of the bonding layer 32 with respect to the conductive member 10 is favorable when the composition of the bonding layer 32 contains tin. This sufficiently secures the contact area of the conductive member 10 with respect to the bonding layer 32.

Third Embodiment

Figure 19:
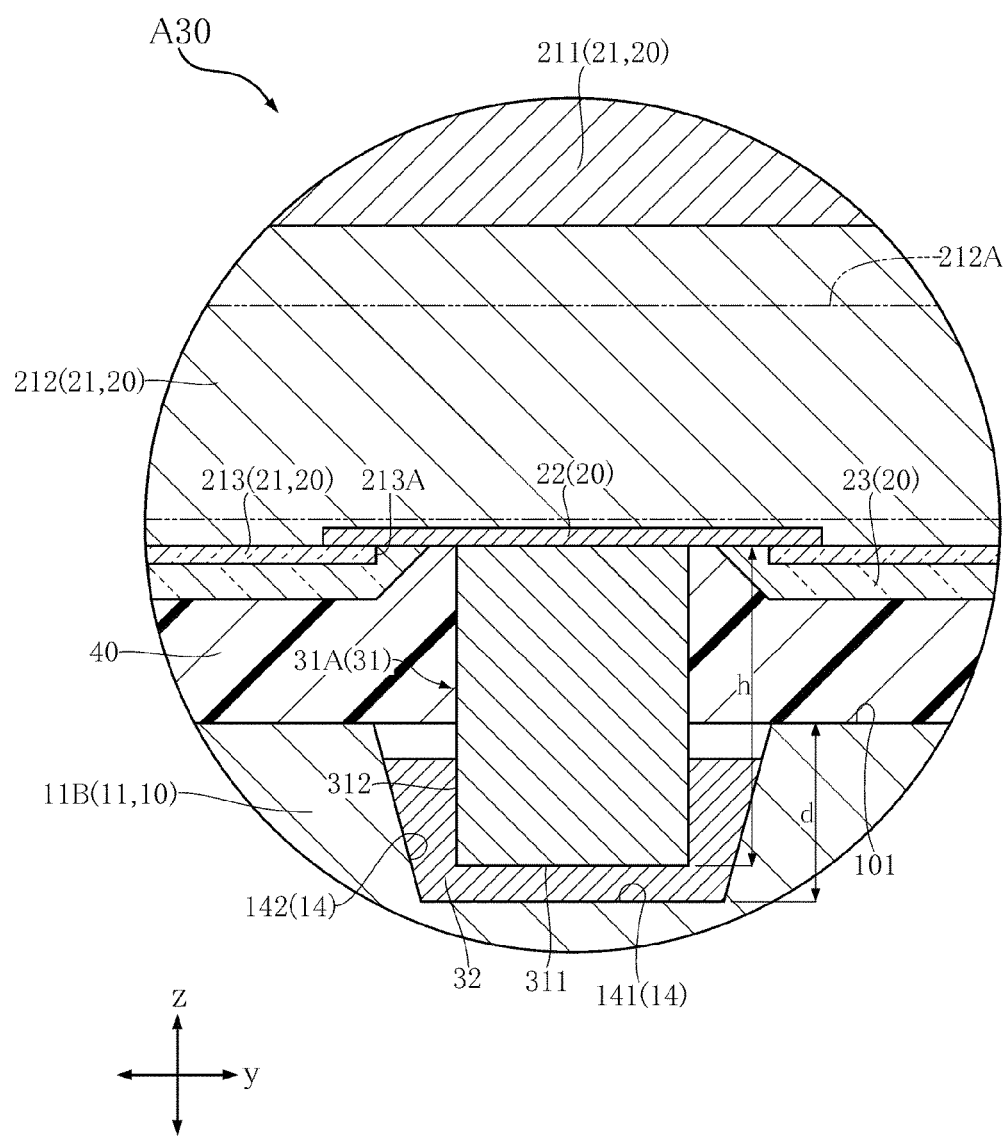
FIG. 19 is a partially enlarged cross-sectional view of a semiconductor device according to a third embodiment of the present disclosure.

A semiconductor device A30 according to a third embodiment of the present disclosure will be described with reference to FIG. 19. In FIG. 19, the same elements as or similar elements to those of the semiconductor device A10 are denoted by the same reference signs, and the description thereof will not be repeated. Here, the cross section position of FIG. 19 is the same as the cross section position of FIG. 13.

The configuration of the plurality of recessed portions 14 of the conductive member 10 in the semiconductor device A30 is different from the configuration in the semiconductor device A10.

As illustrated in FIG. 19, the inner side surface 142 is tilted with respect to the bottom surface 141 and the main surface 101 of the conductive member 10 in each of the plurality of recessed portions 14 of the conductive member 10. Therefore, the area of the inner side surface 142 is larger than the area of each of the plurality of recessed portions 14 in the semiconductor device A10. The cross-sectional area of each of the plurality of recessed portions 14 in the direction orthogonal to the thickness direction z gradually decreases from the main surface 101 to the bottom surface 141.

<Modification>

Next, a semiconductor device A31 as a modification of the semiconductor device A30 will be described with reference to FIG. 20. Here, the cross section position of FIG. 20 is the same as the cross section position of FIG. 13.

Figure 20:
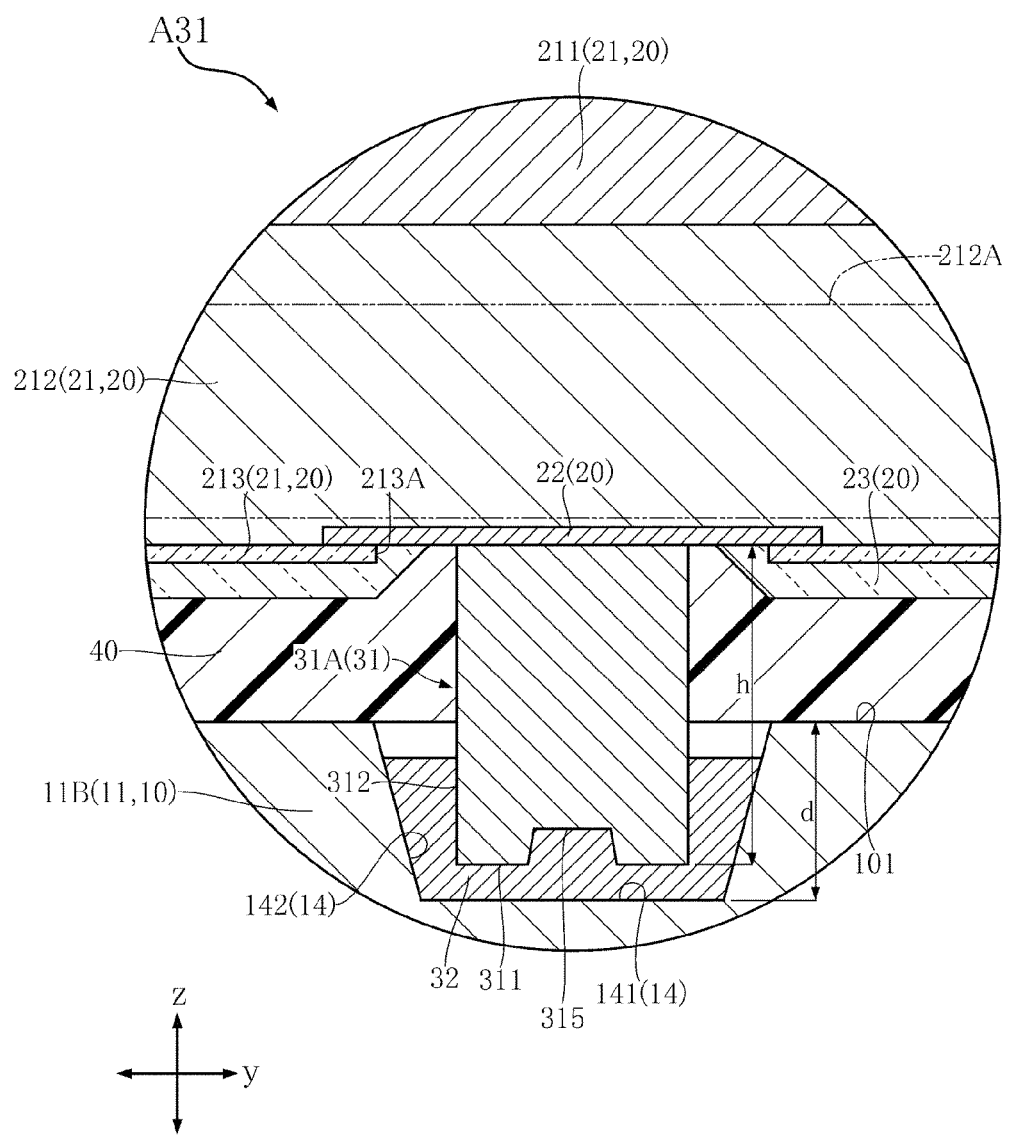
FIG. 20 is a partially enlarged cross-sectional view of a modification of the semiconductor device illustrated in FIG. 19.

As illustrated in FIG. 20, the configuration of the plurality of electrodes 31 in the semiconductor device A31 is different from the configuration in the semiconductor device A30. In the semiconductor device A31, each of the plurality of electrodes 31 includes a depressed portion 315. The depressed portion 315 is recessed from the opposing surface 311 toward the position of the semiconductor element 20 in the thickness direction z. The bonding layer 32 is in contact with the depressed portion 315.

Next, an action and an effect of the semiconductor device A30 will be described.

The semiconductor device A30 includes the conductive member 10 including the plurality of recessed portions 14 recessed in the thickness direction z from the main surface 101; and the plurality of electrodes 31 protruding in the thickness direction z from the plurality of pads 22 of the semiconductor element 20. The plurality of electrodes 31 are separately inserted into the plurality of recessed portions 14. The semiconductor device A30 further includes the bonding layer 32 that is conductive and that is arranged in each of the plurality of recessed portions 14. The conductive member 10 and the plurality of electrodes 31 are bonded through the bonding layers 32. Therefore, the semiconductor device A30 can also prevent the short circuit of the plurality of electrodes 31 and suppress the generation of a crack in the bonding layer 32.

In the semiconductor device A30, the inner side surfaces 142 of the plurality of recessed portions 14 of the conductive member 10 are tilted with respect to the bottom surfaces 141 of the plurality of recessed portions 14 and the main surface 101 of the conductive member 10. This increases the contact area of the conductive member 10 with respect to the bonding layer 32, and the bond strength of the plurality of electrodes 31 with respect to the conductive member 10 can be further improved. The cross-sectional area of each of the plurality of recessed portions 14 in the direction orthogonal to the thickness direction z gradually decreases from the main surface 101 toward the bottom surface 141. This disperses the thermal stress applied to the bonding layer 32, and the flow of the thermal stress in the thickness direction z becomes smoother. This contributes to more effective suppression of the generation of a crack in the bonding layer 32.

In the semiconductor device A31, each of the plurality of electrodes 31 includes the depressed portion 315 recessed in the thickness direction z from the opposing surface 311. The bonding layer 32 is in contact with the depressed portion 315. This increases the contact area of the plurality of electrodes 31 with respect to the bonding layer 32, and the bond strength of the plurality of electrodes 31 with respect to the conductive member 10 can be further improved. Further, an anchor effect with respect to the plurality of electrodes 31 is generated in the bonding layer 32. This contributes to an improvement in the bond strength of the plurality of electrodes 31 with respect to the conductive member 10.

The present disclosure is not limited to the abovementioned embodiments. The specific configuration of each component in the present disclosure can freely be designed and changed in various ways.

The technical configuration of the semiconductor device provided in an embodiment of the present disclosure will supplementarily be described below.

[Supplementary note 1]
A semiconductor device including:
a conductive member including a main surface facing one side in a thickness direction;
a semiconductor element including a plurality of pads facing the main surface of the conductive member; and
a plurality of electrodes protruding from the plurality of pads toward another side in the thickness direction, in which
the conductive member includes a plurality of recessed portions recessed from the main surface toward the other side in the thickness direction,
the semiconductor device further includes a bonding layer that is conductive and that is arranged in each of the plurality of recessed portions,
the plurality of electrodes are separately inserted into the plurality of recessed portions, and
the conductive member and the plurality of electrodes are bonded through the bonding layers.

[Supplementary note 2]
The semiconductor device according to supplementary note 1, in which
each of the recessed portions includes a bottom surface facing the same side as a side that the main surface is facing in the thickness direction,
each of the electrodes includes an opposing surface facing the bottom surface of the corresponding recessed portion, and
the bonding layer is in contact with the bottom surface of the recessed portion and the opposing surface of the electrode.

[Supplementary note 3]
The semiconductor device according to supplementary note 2, in which
the recessed portion includes an inner side surface connected to the bottom surface and the main surface,
the electrode includes an outer side surface that is connected to the opposing surface and that is facing the inner side surface of the recessed portion, and
the bonding layer is in contact with the inner side surface of the recessed portion and the outer side surface of the electrode.

[Supplementary note 4]
The semiconductor device according to supplementary note 3, in which
the inner side surface of the recessed portion is tilted with respect to each of the bottom surface and the main surface.

[Supplementary note 5]
The semiconductor device according to supplementary note 4, in which
a cross-sectional area of the recessed portion in a direction orthogonal to the thickness direction gradually decreases from the main surface toward the bottom surface.

[Supplementary note 6]
The semiconductor device according to supplementary notes 3 to 5, in which
the electrode includes a depressed portion recessed from the opposing surface toward the one side in the thickness direction, and
the bonding layer is in contact with the depressed portion.

[Supplementary note 7]
The semiconductor device according to supplementary notes 1 to 6, in which
the bonding layer contains metal, and
a composition of the metal contains tin.

[Supplementary note 8]
The semiconductor device according to supplementary notes 1 to 6, in which
the bonding layer includes a metal portion and an insulating portion, and
at least a part of the insulating portion contains a resin.

[Supplementary note 9]
The semiconductor device according to supplementary note 8, in which
the metal portion is a sintered body.

[Supplementary note 10]
The semiconductor device according to supplementary note 8 or 9, in which
the insulating portion includes an air gap.

[Supplementary note 11]
The semiconductor device according to supplementary notes 8 to 10, in which
a composition of the metal portion contains silver.

[Supplementary note 12]
The semiconductor device according to supplementary notes 7 to 11, in which
a composition of the electrode contains copper.

[Supplementary note 13]
The semiconductor device according to supplementary note 12, in which
the electrode includes a main portion formed on corresponding one of the pads and a sub portion covering the main portion,
a composition of the main portion contains copper, and
a composition of the sub portion contains palladium.

[Supplementary note 14]
The semiconductor device according to supplementary note 13, in which
the sub portion includes a first layer covering the main portion and a second layer covering the first layer,
a composition of the first layer contains nickel, and
a composition of the second layer contains palladium.

[Supplementary note 15]
The semiconductor device according to supplementary notes 1 to 14, further including:
a sealing resin that is in contact with the main surface of the conductive member and that covers the semiconductor element and the plurality of electrodes, in which the sealing resin includes a part provided between the main surface of the conductive member and the semiconductor element.

[Supplementary note 16]

The semiconductor device according to supplementary note 15, in which the conductive member includes a back surface facing a side opposite to the side that the main surface is facing in the thickness direction, and the back surface is exposed from the sealing resin.

What is claimed is:

1. A semiconductor device, comprising:
    a conductive member including a main surface facing a first side in a thickness direction;
    a semiconductor element including a plurality of pads facing the main surface of the conductive member;
    a plurality of electrodes protruding from the plurality of pads toward a second side in the thickness direction, wherein
        each of the plurality of electrodes has a columnar shape,
        the conductive member further includes a plurality of recessed portions recessed from the main surface toward the second side in the thickness direction, and
        each of the plurality of recessed portions has the columnar shape; and
    a bonding layer that is conductive and that is arranged in each of the plurality of recessed portions, wherein
        the plurality of electrodes is separately inserted into the plurality of recessed portions,
        the conductive member is bonded to the plurality of electrodes through the bonding layer, and
        the plurality of recessed portions of the conductive member is disposed only at positions corresponding to the plurality of electrodes such that a number of the plurality of recessed portions of the conductive member is equal to a number of the plurality of electrodes.

2. The semiconductor device according to claim 1, wherein
    each of the plurality of recessed portions includes a bottom surface facing a same side as the first side that the main surface is facing in the thickness direction,
    each of the plurality of electrodes includes an opposing surface facing the bottom surface of a corresponding recessed portion of the plurality of recessed portions, and
    the bonding layer is in contact with the bottom surface of the corresponding recessed portion and the opposing surface of an electrode of the plurality of electrodes.

3. The semiconductor device according to claim 2, wherein
    the corresponding recessed portion includes an inner side surface connected to the bottom surface and the main surface,
    the electrode includes an outer side surface that is connected to the opposing surface and that is facing the inner side surface of the corresponding recessed portion, and
    the bonding layer is in contact with the inner side surface of the corresponding recessed portion and the outer side surface of the electrode.

4. The semiconductor device according to claim 3, wherein the inner side surface of the corresponding recessed portion is tilted with respect to each of the bottom surface and the main surface.

5. The semiconductor device according to claim 4, wherein a cross-sectional area of the corresponding recessed portion in a direction orthogonal to the thickness direction gradually decreases from the main surface toward the bottom surface.

6. The semiconductor device according to claim 3, wherein
    the electrode includes a depressed portion recessed from the opposing surface toward the first side in the thickness direction, and
    the bonding layer is in contact with the depressed portion.

7. The semiconductor device according to claim 1, wherein
    the bonding layer contains a metal, and
    a composition of the metal contains tin.

8. The semiconductor device according to claim 1, wherein
    the bonding layer includes a metal portion and an insulating portion, and
    at least a part of the insulating portion contains a resin.

9. The semiconductor device according to claim 8, wherein the metal portion is a sintered body.

10. The semiconductor device according to claim 8, wherein the insulating portion includes an air gap.

11. The semiconductor device according to claim 8, wherein a composition of the metal portion contains silver.

12. The semiconductor device according to claim 7, wherein a composition of each of the plurality of electrodes contains copper.

13. The semiconductor device according to claim 12, wherein
    each of the plurality of electrodes includes a main portion formed on corresponding one of the plurality of pads and a sub portion covering the main portion,
    a composition of the main portion contains copper, and
    a composition of the sub portion contains palladium.

14. The semiconductor device according to claim 13, wherein
    the sub portion includes a first layer covering the main portion and a second layer covering the first layer,
    a composition of the first layer contains nickel, and
    a composition of the second layer contains palladium.

15. The semiconductor device according to claim 1, further comprising a sealing resin that is in contact with the main surface of the conductive member and that covers the semiconductor element and the plurality of electrodes,
    wherein the sealing resin includes a part between the main surface of the conductive member and the semiconductor element.

16. The semiconductor device according to claim 15, wherein
    the conductive member further includes a back surface facing a side opposite to the first side that the main surface is facing in the thickness direction, and
    the back surface is exposed from the sealing resin.

17. The semiconductor device according to claim 1, wherein
    each of the plurality of recessed portions includes a bottom surface and an inner side surface connected to the bottom surface, and
    the inner side surface is perpendicular to the bottom surface.

18. The semiconductor device according to claim 17, wherein
    each of the plurality of electrodes includes an opposing surface and an outer side surface connected to the opposing surface, the opposing surface of each of the plurality of electrodes faces the bottom surface of a corresponding recessed portion of the plurality of recessed portions, and the outer side surface is perpendicular to the opposing surface.

* * * * *